(12) United States Patent
Kakugawa et al.

(10) Patent No.: US 8,781,763 B2
(45) Date of Patent: Jul. 15, 2014

(54) METHOD FOR ANALYZING OPERATING POINT OF PERMANENT MAGNET, PROGRAM THEREFOR, AND RECORDING MEDIUM

(75) Inventors: Shigeru Kakugawa, Hitachi (JP); Masashi Kitamura, Mito (JP); Kohji Maki, Hitachi (JP); Shinji Sugimoto, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 373 days.

(21) Appl. No.: 13/210,454

(22) Filed: Aug. 16, 2011

(65) Prior Publication Data

US 2012/0053866 A1 Mar. 1, 2012

(30) Foreign Application Priority Data

Aug. 25, 2010 (JP) ................................. 2010-187964

(51) Int. Cl.
*G01R 15/00* (2006.01)
*G01R 33/12* (2006.01)

(52) U.S. Cl.
USPC ............................................ 702/57; 324/205

(58) Field of Classification Search
USPC ............... 702/57, 81, 84, 127, 150, 155–158, 702/180, 182, 189; 703/1–2, 4; 324/151 A, 324/151 R, 300, 205, 209, 260
See application file for complete search history.

(56) References Cited

FOREIGN PATENT DOCUMENTS

| JP | 2002-328956 | 11/2002 |
| JP | 2004-127056 | 4/2004 |

OTHER PUBLICATIONS

Kitamura et al., A Shape Optimization Method Based on Complex Expressions of 2-Dimensional Magnetic Fields, Mar. 1997, IEEE Transactions on Magnetics, vol. 33, No. 2, pp. 1884-1887.*

* cited by examiner

*Primary Examiner* — Toan Le
(74) *Attorney, Agent, or Firm* — Antonelli, Terry, Stout & Kraus, LLP.

(57) ABSTRACT

A method for analyzing an operating point of a permanent magnet performs electromagnetic field analysis based on a B-H curve of the permanent magnet and element data concerning a finite number of elements into which the permanent magnet is divided to obtain the operating point of the permanent magnet. The method includes the steps of storing data of inputted B-H curve; obtaining magnetic flux densities and magnetic fields in plural regions of the permanent magnet by performing the electromagnetic field analysis based on the data of the B-H curve; and obtaining the operating point of each of the elements based on the result of the electromagnetic field analysis by employing a variable, the variable continuously varying in a first quadrant, in a second quadrant, in a third quadrant, and over these quadrants of the B-H curve and linearly varying with respect to the magnetic flux density and magnetic field.

9 Claims, 27 Drawing Sheets

US 8,781,763 B2

METHOD FOR ANALYZING OPERATING POINT OF PERMANENT MAGNET, PROGRAM THEREFOR, AND RECORDING MEDIUM

CLAIM OF PRIORITY

The present application claims priority from Japanese Patent Application JP 2010-187964 filed on Aug. 25, 2010, the content of which is hereby incorporated by reference into this application.

FIELD OF THE INVENTION

The present invention relates to an analysis method for calculating positions on a magnetic flux density versus magnetic field curve of plural regions of a permanent magnet on the basis of data of the magnetic flux density versus magnetic field curve of the permanent magnet, an analysis program, and a recording medium in which the analysis program is recorded.

BACKGROUND OF THE INVENTION

In electromagnetic equipment having a permanent magnet incorporated therein, it is indispensable to take account of a magnetic flux density (B) versus magnetic field (H) curve (hereinafter called a B-H curve) of a permanent magnet. The permanent magnet is naturally employed while being magnetized in any method.

A general behavior of a permanent magnet on a B-H curve and a way of handling the permanent magnet will be described below in case of their being needed in due course for description of the present invention.

FIG. 1 shows an example of a B-H curve of a permanent magnet. The horizontal axis indicates a magnetic field H, and the vertical axis indicates a magnetic flux density B. When the permanent magnet is not magnetized 1, if an external magnetic field is applied to the permanent magnet, the magnetic flux density B increases along an initial magnetization curve 2. At this time, as shown in FIG. 1, the magnetic flux density B initially sharply increases. Thereafter, a saturation phenomenon takes place as seen in a domain 3.

When the applied magnetic field H is diminished in the above state, the magnetic flux density B traces a curve that specifies larger values than the values specified by the initial magnetization curve 2. When the applied magnetic field H becomes null, the magnetic flux density B takes on a value 4 larger than zero. The value 4 represents a remanent magnetic flux density. The permanent magnet exhibits a large value of the remanent magnetic flux density. In case the permanent magnet is made of neodymium (Nd) that is a rare earth element, the remanent magnetic flux density reaches approximately 1.2 tesla (T).

Thereafter, when the magnetic field H is inversely applied, the magnetic flux density B moderately decreases. Thereafter, the magnetic flux density B sharply decreases to take on a negative value. At this time, an intercept 5 on the H axis represents a coercive force (Hc). In order to explicitly signify that the vertical axis indicates the magnetic flux density B, the coercive force is given a symbol bHc. In electromagnetic equipment employing a permanent magnet, a portion of a B-H curve from a point indicating a remanent magnetic flux density to a point indicating the coercive force is especially important. The portion is referred to as a demagnetization curve 6. As shown in FIG. 1, the magnetic flux density B changes along with a change in the applied magnetic field H.

The curves expressing a change in the magnetic flux density B with respect to the applied magnetic field H refer to a hysteresis loop. When the hysteresis loop is such that the amplitude of the applied magnetic field H is sufficiently large and the magnetic flux density B is saturated in both positive and negative domains, the hysteresis loop is called a major loop. Otherwise, the hysteresis loop is called a minor loop. A description has been made using terminology that is normally employed in physics and engineering. Even when any other terminology is employed, a person with an ordinary skill in the art can easily understand the description. The same applies to a description of the present invention to be made later.

As mentioned above, a B-H curve of a permanent magnet continuously changes over the first, second, third, and fourth quadrants in a magnetic field H versus magnetic flux density B orthogonal coordinate system. Therefore, a position of the permanent magnet on the B-H curve lies in any of the first, second, third, and fourth quadrants. A change in the position should fundamentally be continuously expressed whether it involves the quadrants or not.

By the way, as an index generally employed in designing a magnetic circuit that includes a permanent magnet, a permeance coefficient is available. The permeance coefficient will be briefed below.

A magnetic field which, as shown in FIG. 2, a coil 7 (N denotes the number of turns and I denotes the current) induces in an ambient space will be discussed below. In a magnetic flux tube 8 shown in the drawing, a line integral of a magnetic field H along a magnetic flux from a point A 9 to a point B 10 is provided, using an equation $$\bar{H} = -\bar{\nabla} \cdot \phi_m, \quad (1)$$

as $$\int_A^B H dl = -\int_A^B d\phi_m = \phi_{m,A} - \phi_{m,B} = F_{AB}. \quad (2)$$

A difference in a magnetic (scalar) potential $\phi_m$ is referred to as a magnetomotive force. If a path of integration encircles a current, the magnetomotive force comes to a sum of values of a current passing through a closed curve. When a magnetic flux density on a cross section of the magnetic flux tube 8 can be regarded as being constant, a magnetic flux flowing at an arbitrary position in the magnetic flux tube 8 is written, using an equation $$\Phi = BS = \mu H S, \quad (3)$$

as $$F_{AB} = \Phi \int_A^B \frac{dl}{\mu S}. \quad (4)$$

At this time, a magnetic resistance (reluctance) between the point A 9 and point B 10 is provided as $$R_{AB} = \int_A^B \frac{dl}{\mu S}, \quad (5)$$

and an equation $$F_{AB} = \Phi R_{AB} \quad (6)$$

is obtained.

A reciprocal of the reluctance or magnetic resistance is a permeance. Thus, when a general magnetic circuit is treated, the permeance is employed.

Next, a magnetic circuit including a permanent magnet will be discussed below. For brevity's sake, a description will be made of a case where a leakage magnetic flux is absent. Noted will be a magnetic flux density in an air gap 11 in a magnetic circuit shown in FIG. 3. Using subscripts g, i, and p, quantities relating to the air gap 11, an iron 12, and a permanent magnet 13 will be discriminated from one another. Assuming that H denotes a magnetic field in the permanent magnet 13, B denotes a magnetic flux density, l denotes a magnetic path length of each part, and S denotes a sectional area, an equation is drawn out due to the Ampere's rule as $$H_g l_g + H_i l_i + H l_p = 0. \tag{7}$$

Since a magnetic flux remains constant on any section, a relationship $$BS_p = \mu_0 H_g S_g = \mu_i H_i S_i \tag{8}$$

is established.

Herein, the $H_i$ and $S_i$ values of the iron 12 are mean values obtained along the entire magnetic path. Accordingly, a permeance coefficient $$p = -\frac{B}{H} = \frac{l_p}{S_p}\left(\frac{l_g}{\mu_0 S_g} + \frac{l_i}{\mu_i S_i}\right)^{-1} \tag{9}$$

is obtained.

FIG. 4 shows a relationship of the magnetic flux density B and magnetic field H of the permanent magnet to a demagnetization curve. The vertical axis indicates the magnetic flux density B and the horizontal axis indicates the magnetic field H. The vertical axis and the horizontal axis intersect at an origin of coordinates 14. A demagnetization curve 15 crosses the vertical axis at a point of a remanent magnetic flux density 16, and crosses the horizontal axis at a point of a coercive force (bHc) 17. A point of a mean magnetic flux density of the permanent magnet and a point of a mean magnetic field thereof are present on the demagnetization curve 15. In FIG. 4, they shall coincide with an operating point 18. At this time, θ shall denote an angle 19 at which a half line extending from the origin of coordinates 14 to the operating point 18 meets the horizontal axis. Based on the definition of a permeance coefficient p, an equation $$p = -\frac{B}{H} = \frac{l_p}{S_p}\left(\frac{l_g}{\mu_0 S_g} + \frac{l_i}{\mu_i S_i}\right)^{-1} = \tan(\theta) \tag{10}$$

is drawn out. The B and H values are determined with a position of the permanent magnet 13 on the demagnetization curve 15, that is, the operating point 18. A magnetic flux density in the air gap 11 is determined as $$B_g = \mu_0 H_g. \tag{11}$$

Meanwhile, an equation $$R = \frac{1}{P} = \frac{l_g}{\mu_0 S_g} + \frac{l_i}{\mu_i S_i} \tag{12}$$

expresses a magnetic resistance of an external magnetic circuit viewed from the permanent magnet 13. Accordingly, an equation $$p = P\frac{l_p}{S_p} \tag{13}$$

is drawn out. Therefore, the permeance coefficient p can be regarded as a value per unit volume of the permanent magnet 13 into which a permeance P of the external magnetic circuit is converted.

The foregoing way of thinking of a magnetic circuit has been adopted in the past. Before numerical analysis such as an analysis of the finite element method to be implemented by a computer is put to practical use, the way of thinking has widely been adopted as a design method for electromagnetic equipment employing a permanent magnet. As mentioned above, since it is easy to learn a physical relationship to a permeance P of an external magnetic circuit, when an operating point on a demagnetization curve of the permanent magnet is expressed, a permeance coefficient p has been generally used. A method for expressing the operating point with the permeance coefficient is widely adopted even at present when the numerical analysis such as the analysis of the finite element method to be implemented by a computer is used in practice. Examples are found in patent documents 1 and 2 (JP-A-2002-328956 and JP-A-2004-127056 respectively).

As described previously, a method for expressing an operating point of a permanent magnet using a permeance coefficient is quite advantageous because of the easiness in establishing a physical relationship to a magnetic circuit including a permanent magnet. Therefore, the method has been widely and generally used to date.

As described previously, the permeance coefficient has a physical meaning that is a value per unit volume of a permanent magnet into which a permeance P of an external magnetic circuit is converted. Since the permeance P of the magnetic circuit is a reciprocal of a magnetic resistance of the magnetic circuit and the magnetic resistance takes on a positive value, the permeance coefficient expressed by the equation (10) is also physically defined to take on a positive value. Namely, the permeance coefficient takes on a positive value determined with a geometrical shape.

As seen from the equation (10), when the operating point shifts from the first quadrant of a B-H curve to the second quadrant thereof, the permeance coefficient becomes discontinuous after exhibiting an infinite divergence (when the angle 19 (θ) shown in FIG. 4 is 90°). Therefore, as shown in FIG. 1, a position on the B-H curve of a permeance magnet, that is, an operating point lies in any of the first, second, third, and fourth quadrants. A change in the position should fundamentally be continuously expressed whether it involves the quadrants or not. Nevertheless, the change cannot be continuously expressed using the permeance coefficient.

Further, expressing an operating point of a permeance magnet using a permeance coefficient poses a problem in terms of design of electromagnetic equipment.

Needless to say, it is a magnetic flux density B and a magnetic field H that determines an operating point of a permeance magnet. As for the magnetic flux density B and magnetic field H, when they are indicated linearly, it is often more helpful in design of a magnetic circuit. More particularly, when a sectional area of a certain part of the magnetic circuit is increased 10%, the magnetic flux density B in the part is thought to decrease approximately 10%. In reality, even in a brochure of a permanent magnet manufacturer, a demagnetization curve is linearly plotted with respect to the magnetic flux density B and magnetic field H.

Even if a magnetic circuit is modified in order to decrease the magnetic flux density of a permanent magnet by 10%, a permeance coefficient representing an operating point of the permanent magnet on the demagnetization curve shown in FIG. 4 does not decrease 10%. This is because the permeance coefficient representing the operating point is defined with a slope as it is expressed by the equation (10). Specifically, electromagnetically, when the magnetic flux density B and magnetic field H are linearly indicated, a magnetic-circuit issue can be easily dealt with. Nevertheless, the permeance coefficient representing the operating point of the permanent magnet does not linearly change along with changes in the magnetic flux density B and magnetic field H respectively. This poses a problem in that it is hard to grasp the relationship among the magnetic flux density B and magnetic field H of the magnetic circuit and the permeance coefficient representing the operating point of the permanent magnet.

In addition, when the operating point of a permanent magnet is represented by a permeance coefficient, a problem described below further arises. The problem as well as the aforesaid problems will be detailed below.

A B-H curve of a permanent magnet fundamentally exhibits a nonlinear characteristic like the one shown in FIG. 1. However, the demagnetization curve 6 in FIG. 1 is often, as shown in FIG. 5, plotted in a simplified manner. In FIG. 5, the demagnetization curve 6 in FIG. 1 is plotted to include demagnetization curves 20 and 21. The demagnetization curve 20 intersects the vertical axis at a point of a remanent magnetic flux density 22. Operating points 23 and 24 are operating points in the domains of the demagnetization curves 20 and 21 respectively. A point of intersection between the demagnetization curve 20 and demagnetization curve 21 is a knickpoint 25 corresponding to a point on the demagnetization curve 6 in FIG. 1 at which the magnetic flux density sharply decreases. The knickpoint 25 may be called an irreversible demagnetization beginning point or a bend point. When the demagnetization curve can be, as shown in FIG. 5, treated approximately, the demagnetization curve is said to have excellent squareness. A permanent magnet made of Nd that is a rare earth element and has been adopted in recent years is said to be excellent in the squareness.

When an operating point lies in the domain of the demagnetization curve 20, whether a magnetic field H increases or decreases, the operating point 23 is thought to reversibly shift on the demagnetization curve 20. Therefore, a phenomenon that the permanent magnet irreversibly weakens due to the magnetic field H, that is, demagnetization is not thought to occur.

In contrast, when a negative magnetic field H (a magnetic field H in a negative direction on a B-H curve) increases, the operating point shifts to a domain on a negative magnetic field H side beyond the knickpoint 25, for example, to the operating point 24. In this case, even if the negative magnetic field H decreases to be null, the operating point does not return along the demagnetization curve 20 but traces a minor loop 26 lying below and substantially in parallel to the demagnetization curve 20. A remanent magnetic flux density becomes a remanent magnetic flux density 27 smaller than the initial remanent magnetic flux density 22. This is a demagnetization phenomenon that a magnet gets weakened. When demagnetization occurs, electromagnetic equipment employing the permanent magnet fails to exert the performance as initially designed. Therefore, it is quite significant that the permanent magnet is designed so as not to be demagnetized even when the electromagnetic equipment is operated.

As described later, in reality, an operating point exhibits a distribution inside a permanent magnet. Therefore, it is essential to accurately learn not only an average operating point of the permanent magnet but also a ratio at which certain part of the magnet indicated with a certain operating point occupies the whole of the magnet. When limit design is performed in terms of temperature or a magnetic field, if electromagnetic equipment including a permanent magnet is operated, it becomes necessary to accurately grasp a radio at which an internal part of the magnet that is demagnetized occupies the whole of the magnet. However, when the operating point is represented by a permeance coefficient, that is, expressed with a slope in the second quadrant of a B-H curve linearly plotted with respect to a magnetic flux density B and a magnetic field H, the relationship of the permeance coefficient to an associated area in the permanent magnet is hard to understand.

FIG. 6 shows an example in which a permeance coefficient representing an operating point is indicated in a graph in which a demagnetization curve and the operating point are plotted. The permeance coefficient takes on a value obtained by multiplying a value 28 in the drawing by a permeability $\mu_0$ in a vacuum. This kind of drawing is often carried in a brochure published from a magnet manufacturer. In this example, the permeance coefficient representing an operating point 29 is 1.2, and the permeance coefficient representing a knickpoint 30 is 0.4.

As apparent from FIG. 6, when a magnitude of a change in a negative magnetic field H is small, a magnitude of a change in the permeance coefficient is small in a domain in which the permeance coefficient takes on a small value. The magnitude of the change in the permeance coefficient is large in a domain in which the permeance coefficient takes on a large value. Therefore, in the domain in which the permeance coefficient takes on a large value, the change in the permeance coefficient looks large for a change in the negative magnetic field H. This poses a problem in that the relationship among the magnetic flux density B and magnetic field H of a magnetic circuit and the permeance coefficient representing an operating point of a permanent magnet is hard to grasp.

SUMMARY OF THE INVENTION

The present invention has fundamental features described below. A method for analyzing an operating point of a permanent magnet in accordance with the present invention performs electromagnetic field analysis based on a magnetic flux density versus magnetic field curve of the permanent magnet and element data concerning a finite number of elements into which the permanent magnet is divided in order to obtain the operating point of the permanent magnet by using an arithmetic device including an analysis unit, a memory unit, and a display unit. The method includes the steps of storing data of inputted magnetic flux density versus magnetic field curve in the memory unit; obtaining magnetic flux densities and magnetic fields in a plurality of regions of the permanent magnet by performing the electromagnetic field analysis based on the data of the magnetic flux density versus magnetic field curve stored in the memory unit by using the analysis unit; and obtaining the operating point of each of the elements based on the result of the electromagnetic field analysis by employing a variable, the variable continuously varying in a first quadrant, in a second quadrant, in a third quadrant, and over these quadrants of the magnetic flux density versus magnetic field curve and linearly varying with respect to the magnetic flux density and magnetic field.

Preferably, the method further includes a step of displaying a histogram on the display unit. A horizontal axis in the histogram indicates the variable representing the operating point. A vertical axis in the histogram indicates an area of each of the elements with respect to the variable representing the operating point when the electromagnetic field analysis is two-dimensional analysis. The vertical axis indicates a volume of each of the elements with respect to the variable representing the operating point when the electromagnetic field analysis is three-dimensional analysis.

According to the present invention, a position of an operating point on a B-H curve can be represented by a variable that continuously varies over the first, second, and third quadrants of the B-H curve. Eventually, the relationship among a magnetic flux density B and a magnetic field H of a magnetic circuit and a permeance coefficient at the operating point of a permanent magnet can be easily grasped.

DETAILED DESCRIPTION OF THE PREFERRED EMBODIMENTS

Figure 1:
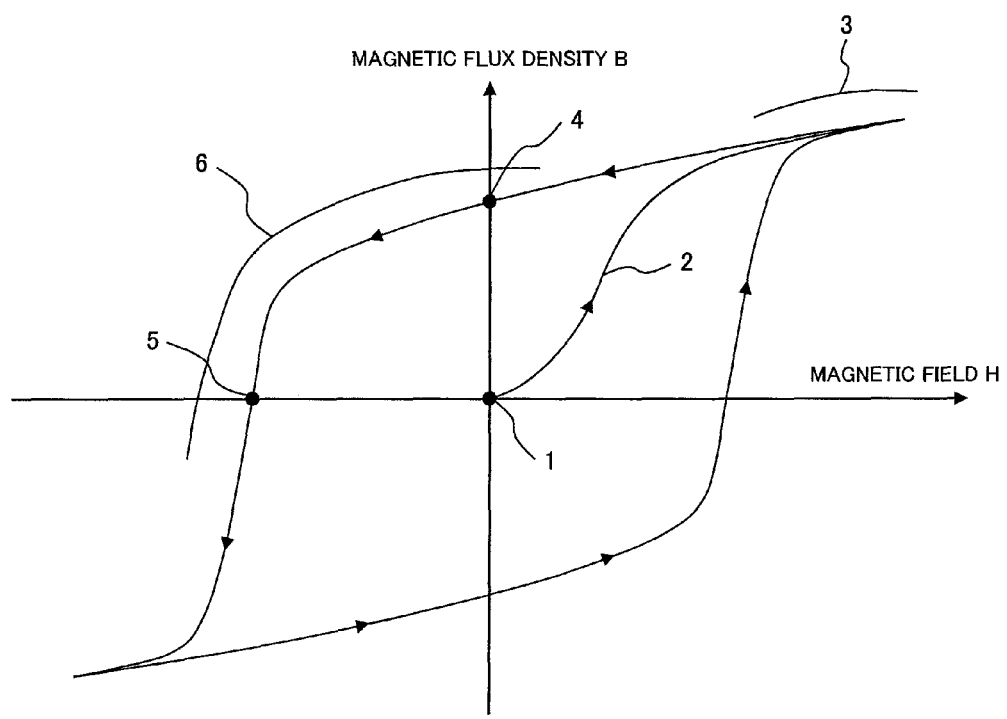
FIG. 1 is a diagram showing an example of a B-H curve of a permanent magnet.
Figure 2:
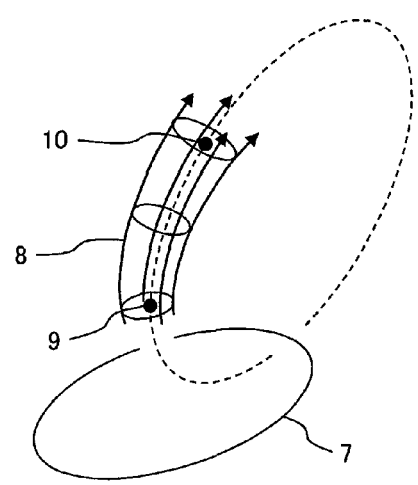
FIG. 2 is an explanatory diagram of a magnetic field which a coil induces in an ambient space.
Figure 3:
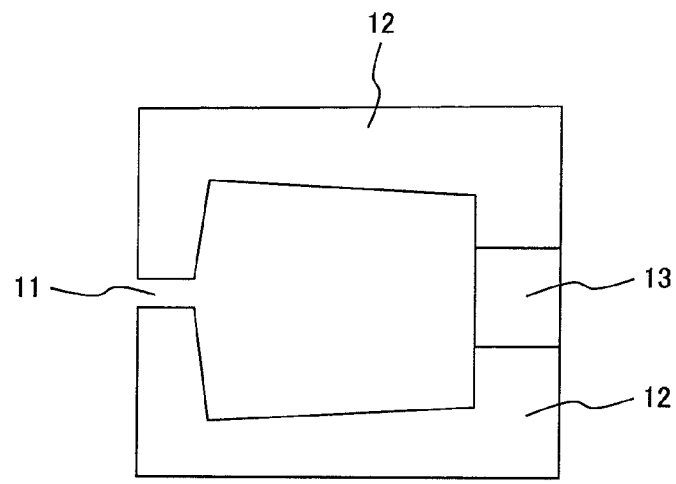
FIG. 3 is a diagram showing a magnetic circuit.
Figure 4:
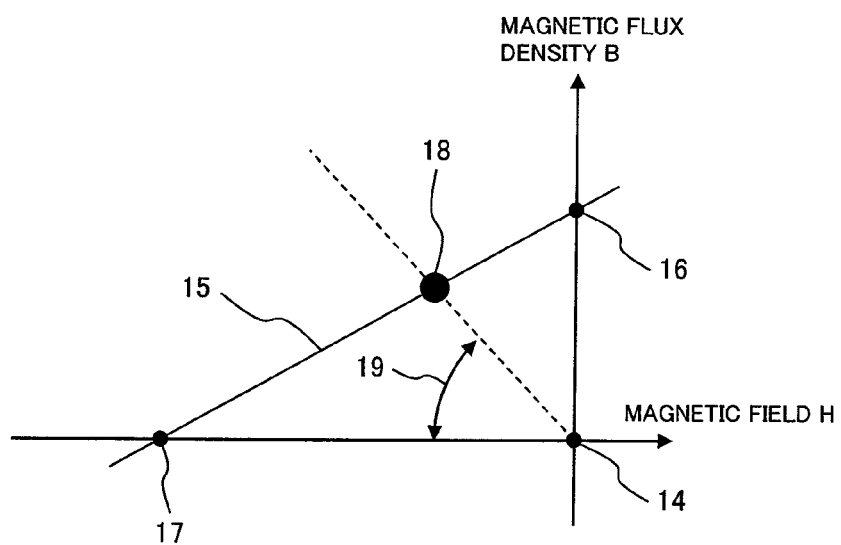
FIG. 4 is a diagram showing a relationship among a magnetic flux density B and a magnetic field H of a permanent magnet and a demagnetization curve.
Figure 5:
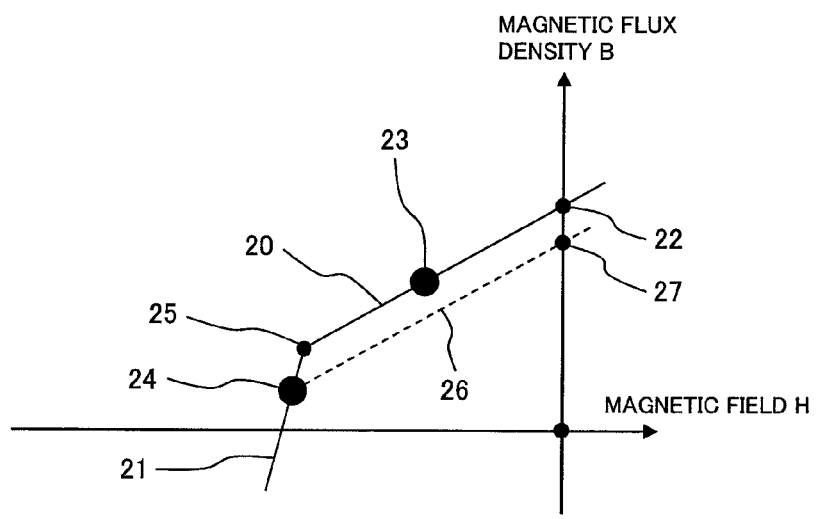
FIG. 5 is a diagram showing an example of a demagnetization curve plotted in a simplified manner.

Referring to the drawings, an embodiment of a method for analyzing operating points of a permanent magnet in accordance with the present invention will be described below. The method for analyzing operating points of a permanent magnet in accordance with the present invention calculates an electromagnetic characteristic of a permanent magnet and a mechanical characteristic thereof such as magnetism, heat, and a stress, and calculates the positions on a B-H curve of plural regions of the permanent magnet on the basis of data of the magnetic flux density B versus magnetic field H curve (B-H curve) of the permanent magnet. The permanent magnet is divided into a finite number of elements, and a variable representing an operating point is calculated for each of the elements. A user can enter element data containing coordinate values or attributes of the elements of the permanent magnet and the like. In addition, the user can enter the data of the B-H curve.

An analysis program in accordance with the present invention is produced by coding a series of processes of the method for analyzing operating points of a permanent magnet in accordance with the present invention. A recording medium in accordance with the present invention is a computer readable recording medium in which the analysis program is recorded.

A method for analyzing operating points of a permanent magnet in accordance with the present invention and a program for analyzing operating points of a permanent magnet in accordance therewith are executed or run by a computer that is an arithmetic device. In addition, a recording medium in accordance with the present invention is read by the computer that is an arithmetic device so that a recorded program can be run. The computer includes an input unit, an analysis unit, a memory unit, and a display unit, and performs inputting of data, analysis thereof, storage of input data or analytical data, and display of a result of analysis.

First Embodiment

Figure 7:
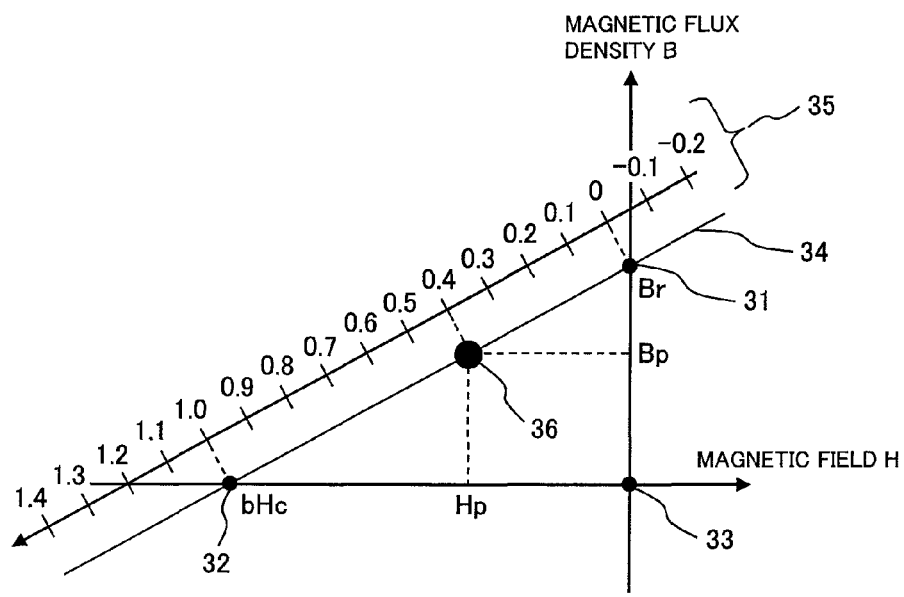
FIG. 7 is a diagram showing a method for analyzing operating points of a permanent magnet in a first embodiment of the present invention.

FIG. 7 shows an analysis method for a position on a B-H curve of a permanent magnet, that is, an operating point in accordance with an embodiment of the method for analyzing operating points of a permanent magnet of the present invention. In FIG. 7, the horizontal axis indicates a magnetic field H and the vertical axis indicates a magnetic flux density B. The axes intersect at an origin 33. Both the horizontal axis and the vertical axis linearly indicate the magnetic field H and magnetic flux density B respectively.

A demagnetization curve 34 is approximately plotted with a straight line and includes a point of a remanent magnetic flux density (Br) and a point of a coercive force (bHc). On the demagnetization curve 34, the point providing the remanent magnetic flux density shall be called a remanent magnetic flux density point 31, and the point providing the coercive force shall be called a coercive force point 32. An operating point 36 of a permanent magnet lies naturally on the demagnetization curve 34.

A variable 35 representing an operating point is, as shown in the drawing, defined linearly along the B-H curve so that it takes on zero at the remanent magnetic flux density point 31 and 1.0 at the coercive force point 32. Specifically, the variable 35 representing an operating point linearly changes with respect to the magnetic field H and magnetic flux density B. Further, the variable 35 representing an operating point is continuously defined to take on a value that ranges from a negative value to a value equal to or larger than 1.0 over the first, second, and third quadrants. Compared with the related art shown in FIG. 6, a difference in a way of expressing an operating point is easily learned.

The value of the variable 35 representing an operating point in the present embodiment will be described using an equation below. Assuming that Hp denotes a magnetic field at the operating point 36 and Bp denotes a magnetic flux density thereat, the variable representing the operating point 36 is written as $$\frac{Hp}{bHc} \quad (14)$$

or $$1 - \frac{Bp}{Br}. \quad (15)$$

In the present embodiment, as shown in FIG. 7, the value of the variable 35 representing the operating point 36 is 0.4. When the operating point 36 coincides with the remanent magnetic flux density point 31 on the demagnetization curve 34 (an intercept on the magnetic flux density axis) (Hp=0, Bp=Br), the variable 35 representing an operating point shall take on a reference value. The reference value is set to zero. Assume that the variable 35 representing an operating point is defined so that it gets larger along with an increase in the intensity of a negative magnetic field H (a magnetic field H in a negative direction of the B-H curve). In this case, similarly to the present embodiment, when the reference value of the variable 35 representing an operating point is set to the value associated with the remanent magnetic flux density point 31, whether the operating point lies in the first quadrant or in the second quadrant can be easily distinguished based on the value of the variable 35. Likewise, in the present embodiment, a value which the variable takes on when the operating point 36 coincides with the coercive force point 32 (Hp=bHc, Bp=0) is set to 1.0 so that whether the operating point lies in the second quadrant or in the third quadrant can be readily decided based on the value of the variable 35. Naturally, the value may be defined as any other value such as 10.0 or 100.0.

Second Embodiment

Figure 8:
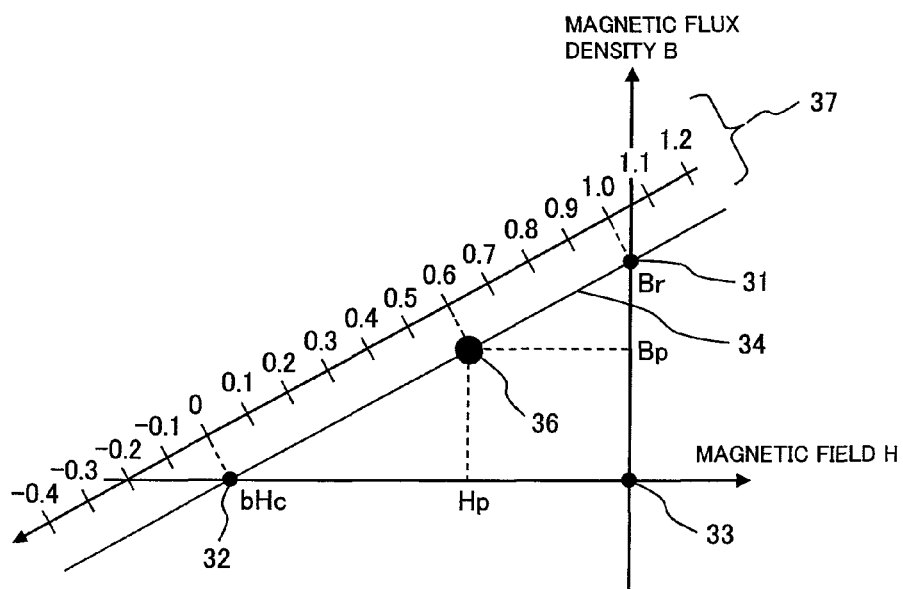
FIG. 8 is a diagram showing a method for analyzing operating points of a permanent magnet in a second embodiment of the present invention.

FIG. 8 shows another analysis method for a position on a B-H curve of a permanent magnet, that is, an operating point in accordance with an embodiment of the method for analyzing operating points of a permanent magnet of the present invention. In FIG. 8, a way of determining coordinates and a demagnetization curve 34 is identical to that in FIG. 7, and symbols and reference numerals are identical to those in FIG. 7.

In the present embodiment, a variable 37 representing an operating point is defined so that the variable representing an operating point takes on a larger value along with a decrease in the intensity of the negative magnetic field H at the operating point 36. The variable 37 representing an operating point is, as shown in the drawing, linearly defined along the B-H curve so that it takes on 1.0 at the remanent magnetic flux density point 31 and zero at the coercive force point 32. Specifically, the variable 37 representing an operating point is linearly changed with respect to the magnetic field H and magnetic flux density B. Further, the variable 37 representing an operating point is continuously defined to take on a value that ranges from a negative value to a value equal to or larger than 1.0 over the first, second, and third quadrants. In the present embodiment, as shown in FIG. 8, the value of the variable 37 representing the operating point 36 is 0.6.

As mentioned above, in the present embodiment, when the operating point 36 coincides with the coercive force point 32 on the demagnetization curve 34 (an intercept on the magnetic field axis) (Hp=bHc, Bp=0), the variable 37 representing an operating point shall take on a reference value. The reference value is set to zero. Assume that the variable 37 representing an operating point is defined so that the variable 37 takes on a larger value along with a decrease in the intensity of the negative magnetic field H. In this case, similarly to the present embodiment, when the reference value of the variable 37 representing an operating point is associated with the coercive force point 32, whether the operating point lies in the second quadrant or in the third quadrant can be easily distinguished based on the value of the variable 37. Likewise, in the present embodiment, a value which the variable takes on when the operating point 36 coincides with the remanent magnetic flux density point 31 (Hp=0, Bp=Br) is set to 1.0 so that whether the operating point lies in the first quadrant or in the second quadrant can be easily decided based on the value of the variable 37. Naturally, the value may be defined as any other value such as 10.0 or 100.0.

Using the magnetic field Hp and magnetic flux density Bp at the operating point 36, the variable representing the operating point 36 can be written as $$1 - \frac{Hp}{bHc} \quad (16)$$

or $$\frac{Bp}{Br}. \quad (17)$$

Third Embodiment

Figure 9:
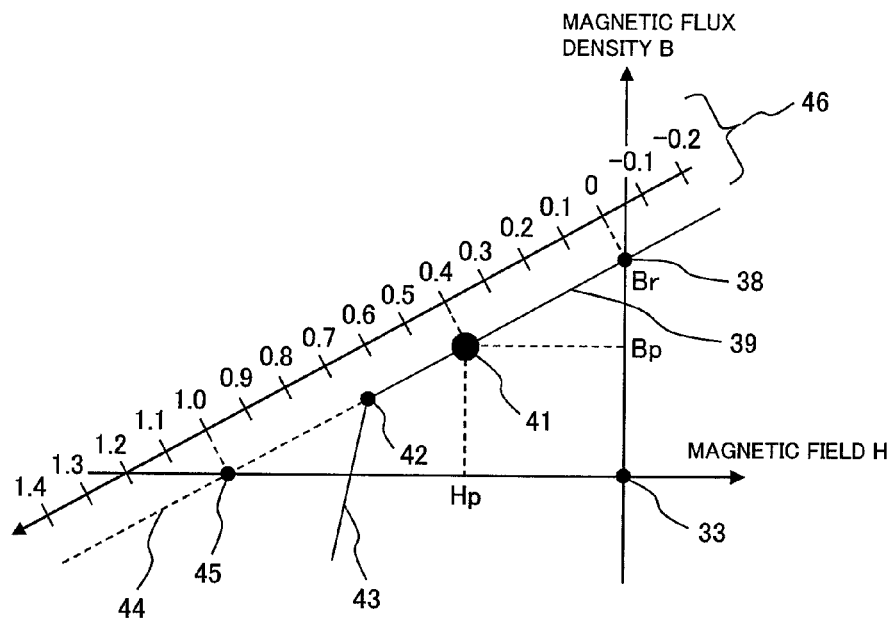
FIG. 9 is a diagram showing a method for analyzing operating points of a permanent magnet in a third embodiment of the present invention.

FIG. 9 shows another analysis method for a position on a B-H curve of a permanent magnet, that is, an operating point in accordance with an embodiment of the method for analyzing operating points of a permanent magnet of the present invention. In FIG. 9, the definitions of the vertical axis and the horizontal axis are identical to those in FIG. 8, and the notation of symbols or reference numerals is identical to that in FIG. 8.

As shown in FIG. 9, a demagnetization curve in the present embodiment has a knickpoint 42 and includes two straight line portions 39 and 43 that join at the knickpoint 42. In the present embodiment, even in this case, when an operating point 41 coincides with a remanent magnetic flux density point 38 on the straight line portion 39 of the demagnetization curve (an intercept on the magnetic flux density axis) (Hp=0, Bp=Br), a variable 46 representing an operating point shall take on a reference value. The reference value is set to zero. In addition, at a point of intersection 45 at which a half line 44 that is an extension of the straight line portion 39 meets the magnetic field axis, the value of the variable 46 representing an operating point shall be 1.0. In reality, the operating point 41 does not shift along the half line 44. However, the above definition is sufficiently advantageous as described later.

When electromagnetic field analysis is performed on electromagnetic equipment, which includes a permanent magnet, using numerical analysis such as the finite element method, a characteristic of a demagnetization curve of the permanent magnet is, as shown in FIG. 9, often treated as that of a straight line expressed with the straight line portion 39 of the demagnetization curve and the half line 44. This is because when the aforesaid squareness of the demagnetization curve of the permanent magnet is good enough, satisfactory approximation is accomplished.

As a method of defining such a demagnetization curve expressed with a straight line, it is generally adopted to determine the remanent magnetic flux density point 38 and point of intersection (coercive force bHc) 45 or to determine the remanent magnetic flux density point 38 and the slope of the straight line portion 39. The slope of the straight line portion 39 of the demagnetization curve is regarded as a recoil permeability.

As mentioned above, when electromagnetic field analysis is performed by treating the demagnetization curve as the straight line expressed with the straight line portion 39 and half line 44, an operating point may naturally shift in the domain of the half line 44 beyond the knickpoint 42. In this case, it is important to accurately learn based on the result of the electromagnetic field analysis that the operating point of the magnet lies in the domain of the half line 44 and to what extent the operating point shifts beyond the knickpoint 42. Thus, the design of the electromagnetic equipment can be modified for fear the operating point of the magnet may shift beyond the knickpoint 42, or in other words, for fear when the electromagnetic equipment is operated, the permanent magnet may be demagnetized to degrade the performance of the electromagnetic equipment. For this purpose, even when the demagnetization curve has the knickpoint 42, expressing the variable 46 representing an operating point in the manner adopted in the present embodiment is advantageous.

Using the magnetic field Hp and magnetic flux density Bp at the operating point 41, the variable representing the operating point 41 can be written as $$1 - \frac{Bp}{Br}. \qquad (18)$$

Fourth Embodiment

Figure 10:
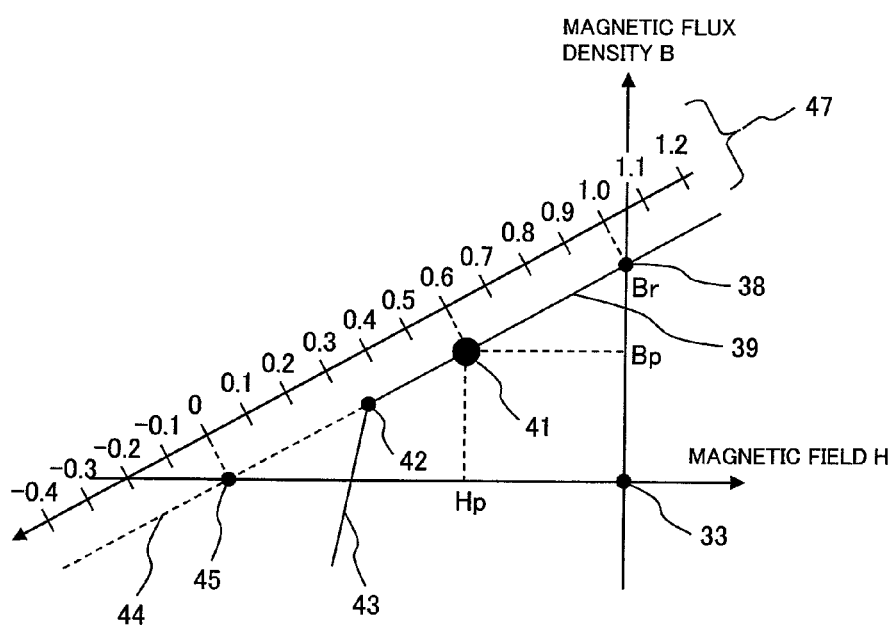
FIG. 10 is a diagram showing a method for analyzing operating points of a permanent magnet in a fourth embodiment of the present invention.

FIG. 10 shows another analysis method for a position on a B-H curve of a permanent magnet, that is, an operating point in accordance with an embodiment of the method for analyzing operating points of a permanent magnet of the present invention. The relationship between FIG. 10 and FIG. 9 is identical to that between FIG. 8 and FIG. 7. A difference lies in a position of a reference value of a variable 47 representing an operating point. Assuming that Hp denotes a magnetic field at the operating point 41 and Bp denotes a magnetic flux density thereat, the variable representing the operating point 41 can be written as $$\frac{Bp}{Br}. \qquad (19)$$

A description has been made of a case where a knickpoint of a demagnetization curve is adopted as an irreversible demagnetization beginning point. The adoption of the knickpoint has, as mentioned above, a sufficient physical significance. However, since the demagnetization curve is a curve, a method of selecting the knickpoint from the demagnetization curve suffers arbitrariness. As a method for solving this problem, an example will be presented below.

Figure 42:
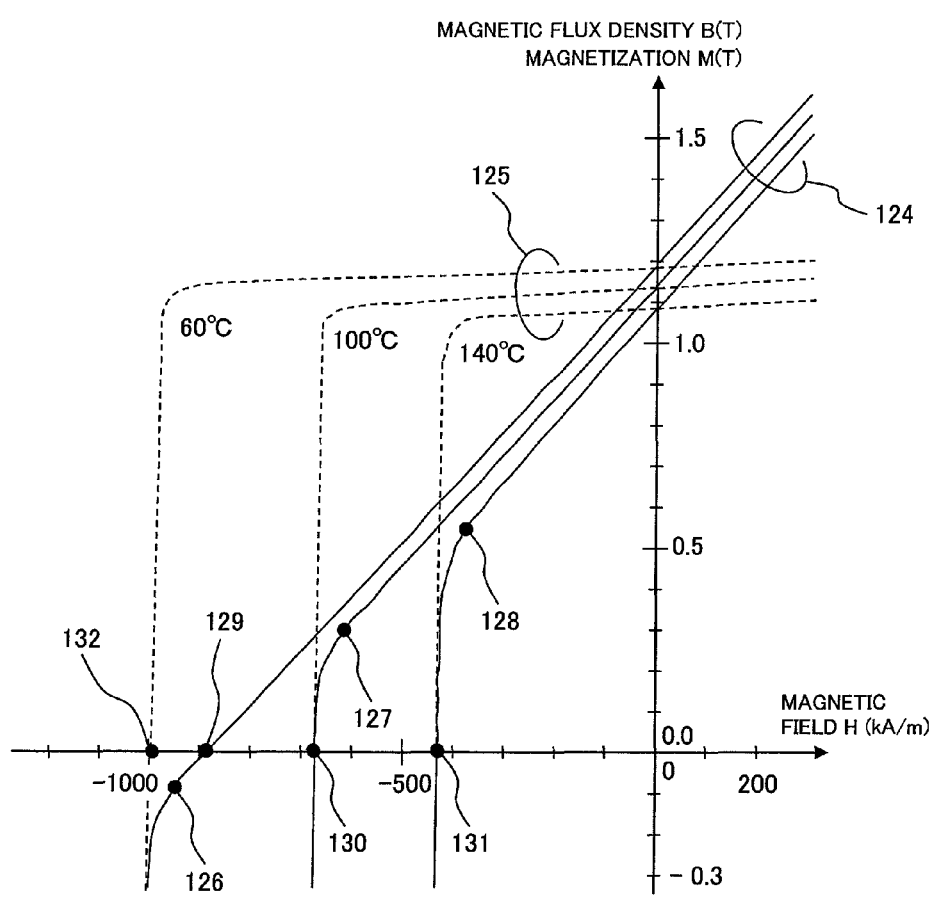
FIG. 42 is a diagram showing demagnetization curves of a typical Nd permanent magnet.

FIG. 42 shows demagnetization curves of a typical Nd permanent magnet. As illustrated, three demagnetization curves shall generically be called demagnetization curves 124. The demagnetization curves 124 are displayed using coordinate axes for a B-H curve as the aforesaid demagnetization curves are. The demagnetization curves obtained at three temperatures of 60° C., 100° C., and 140° C. are displayed comprehensively. Curves 125 are obtained by converting the demagnetization curves 124 (plotted in relation to a magnetic flux density B and a magnetic field H) into curves each expressing a relationship between a magnetization M and the magnetic field H. The curves 125 generically refer to three curves as the demagnetization curves 124 do.

Herein, the magnetic flux density B and magnetization M has a relationship expressed by an equation $$B = \mu_0 H + M. \qquad (20)$$

The magnetic flux density B and magnetization M share the same unit of tesla (T) in the International System of Units (SI).

An intercept of a magnetization M versus magnetic field H curve on a magnetic field axis is generally called an intrinsic coercive force and given iHc. The three demagnetization curves 124 have knickpoints 126, 127, and 128 respectively and have points of coercive force bHc 129, 130, and 131 respectively.

When the temperature is 100° C. or 140° C., the intrinsic coercive force iHc is nearly identical to the coercive force bHc. Specifically, the demagnetization curve at the temperature of 100° C. indicates the intrinsic coercive force iHc 130, and the demagnetization curve at the temperature of 140° C. indicates the intrinsic coercive force iHc 131. In contrast, when the temperature is 60° C., the value of the coercive force bHc 129 is approximately −880 kA/m, while the value of the intrinsic coercive force iHc 132 is approximately −1000 kA/m.

As seen from FIG. 42, differences between the magnetic fields at the knickpoints 126, 127, and 128 respectively and the magnetic fields associated with the intrinsic coercive forces iHc 132, 130, and 131 respectively are nearly identical to one another. As for a difference between the magnetic field at the knickpoint and the magnetic field associated with the coercive force bHc, when the knickpoint on the B-H curve lies in the third quadrant as it does when the temperature is 60° C., compared with when the knickpoint lies in the second quadrant, the magnitude and sign of the difference are apparently different.

As mentioned above, since the intrinsic coercive force iHc has a close relationship to the knickpoint, the point of the intrinsic coercive force iHc may be adopted as a point associated with a reference value of a variable, which represents an operating point, instead of the knickpoint whose selection suffers arbitrariness. The reference value may be set to zero. At this time, assuming that Hp denotes a magnetic field at the operating point, the variable representing an operating point can be written as $$1 - \frac{Hp}{iHc}. \qquad (21)$$

In the aforesaid first to fourth embodiments, a reference value of a variable representing an operating point and a value of a variable are changed at a position on the border between the first quadrant and second quadrant or between the second quadrant and third quadrant. Naturally, the present invention is not limited to the concrete examples. In embodiments to be described later, the variable representing an operating point is treated as shown in FIG. 7 and FIG. 9.

Now, an analysis method for calculating electromagnetic and mechanical characteristics of a permanent magnet such as a magnetism, heat, and a stress, and calculating positions on a B-H curve of plural regions of the permanent magnet (that is, operating points) on the basis of data of the B-H curve of the permanent magnet will be described below in relation to embodiments. Further, an analysis method that employs an operating point analysis unit and a unit on which the shape of the permanent magnet is visually displayed, and utilizes a feature of displaying a zone contour, which is based on variables representing operating points, on the surface of the permanent magnet while superposing it on the shape of the permanent magnet, and a program in which a series of processes of the analysis method is coded will be described in relation to the embodiments. The zone contour refers to a contour drawing (contour map) based on values of the variables representing the operating points. In the zone contour, the values of the variables representing the operating points can be discriminated from one another and displayed in black and white (gray tones) or in colors. For example, as the absolute value of a magnetic field gets larger, the operating point is expressed to relatively approach black in the case of black-and-white display, or expressed to relatively approach red in the case of color display.

Fifth Embodiment

Figure 11:
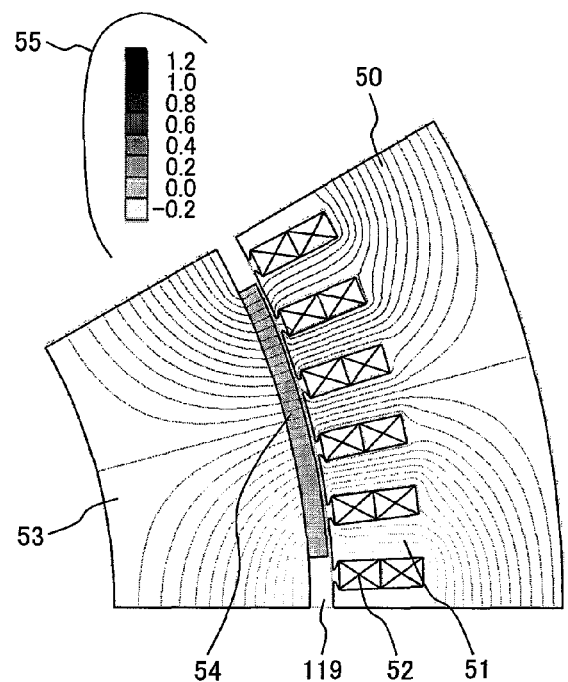
FIG. 11 is a diagram showing a zone contour based on the operating points on the permanent magnet on the basis of a result of electromagnetic field analysis of a motor in a case where a rotor is located at an illustrated position in a fifth embodiment of the present invention.

FIG. 11 shows a result of display performed according to an analysis method for a position on a B-H curve of a permanent magnet, that is, an operating point in accordance with an embodiment of the method for analyzing operating points of a permanent magnet of the present invention, or performed by a program in which the analysis method is implemented. The definitions of a demagnetization curve of the permanent magnet and a variable representing an operating point are identical to those in FIG. 7.

Electromagnetic equipment that is an object of analysis is a surface magnet type permanent magnet synchronous motor (SPMSM). FIG. 11 shows a section of one pole part of a magnet perpendicular to an axis of rotation. A winding 52 is wound about teeth 51 of a stator core 50 in a distributed winding manner. A permanent magnet 54 is disposed on the surface of a rotor core 53. The whole of a rotor and the whole of a stator are concentrically separated from each other by an air gap 119. The permanent magnet 54 is a typical neodymium (Nd) magnet. The remanent magnetic flux density of the permanent magnet is 1.1 tesla, and the recoil permeability thereof is 1.025 times larger than the permeability thereof in a vacuum. The permanent magnet 54 is of a so-called radial magnetization type, and the direction of the remanent magnetic flux density is a radial direction.

FIG. 11 shows a result of electromagnetic field analysis performed according to a two-dimensional finite element method when no current flows into the winding with no load imposed. Streamlines in the drawing express a flow of a magnetic flux (lines of magnetic force). Based on the result of electromagnetic field analysis, a magnetic flux density B and a magnetic field H of each mesh element of the permanent magnet 54 are assigned to a demagnetization curve in order to obtain a value of a variable representing an operating point of each mesh element. Although the rotor rotates, FIG. 11 shows a result of calculation obtained when the rotor is located at an illustrated position.

In FIG. 11, a zone contour is depicted on the permanent magnet 54 based on a gray scale according to values of variables representing operating points. The scale 55 for the zone contour ranges, as shown as an explanatory note in the upper left of the drawing, from −0.2 to 1.2. The values of the variables representing operating points are spatially distributed in the permanent magnet 54. Since no load is imposed, the values are seen small as a whole. As for the spatial distribution of the operating points, there is a difference between a portion opposed to each of the teeth 51 of the stator and a portion opposed to a slot between adjoining teeth. Specifically, the operating points are affected by the position of each of the teeth 51 of the stator and the position on the winding 52, and exhibit a distribution in a direction of an angle of rotation.

Along with the rotation of the rotor, the positional relationship between the permanent magnet 54 and the teeth 51 varies. When a certain part of the permanent magnet 54 is noted, a variable representing an operating point of the part varies along with the rotation of the rotor.

Figure 12:
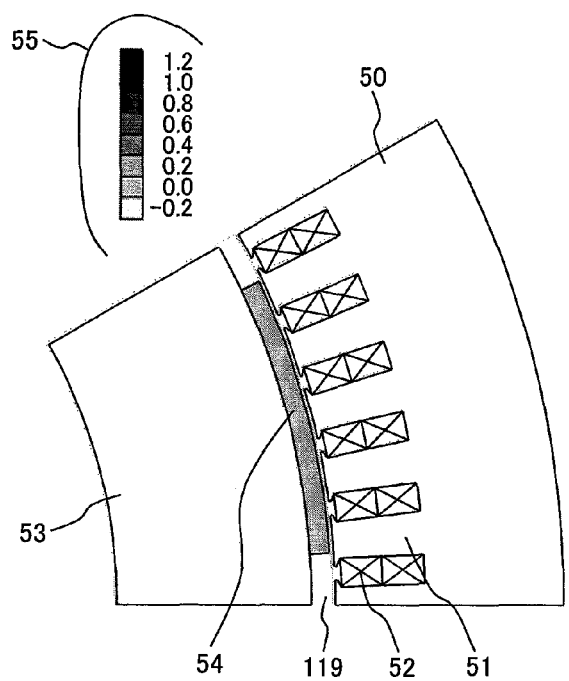
FIG. 12 is a diagram showing a zone contour based on the operating points on the permanent magnet on the basis of a result of electromagnetic field analysis of the motor in a case where the rotor is rotated in the fifth embodiment.

FIG. 12 is a diagram showing a result of electromagnetic field analysis performed by rotating the rotor with no current fed to the winding and with no load imposed. In FIG. 12, a variable representing an operating point of the permanent magnet 54 at each rotational position is obtained from the result of electromagnetic field analysis performed by rotating the rotor. A maximum value of values of a variable representing an operating point of each of elements, which are detected during the rotation of the rotor, (maximum value of absolute values of magnetic fields) is obtained, and the obtained values of variables are displayed in the form of a zone contour similar to that shown in FIG. 11. Specifically, the electromagnetic field analysis performed by rotating the rotor includes plural analysis steps at each of which a rotating state is analyzed, and an operating point at which an absolute value of a magnetic field is the largest among absolute values obtained at the plural analysis steps is regarded as an operating point deriving from the electromagnetic field analysis.

A spatial distribution of variables representing operating points in the permanent magnet 54 is observed nearly in a radial direction alone, but a change is not observed in a rotating direction. A value of a variable representing an operating point corresponds to, as shown in FIG. 11, a maximum value (maximum value among absolute values of magnetic fields) among values which the variable representing the operating point shown in FIG. 11 takes on in a direction of angle of rotation. A value of a variable representing an operating point varies, as shown in FIG. 11, in the permanent magnet 54 along with the rotation of the rotor. An operating point of a certain magnet element shall be an operating point at which a maximum value is obtained among values, which represent operating points, while the positional relationship of the element to the stator changes with the rotation of the rotor. In other words, the operating point of a certain magnet element is an operating point represented by a maximum value which a variable representing an operating point takes on while the positional relationship to the stator changes with the rotation of the rotor. As a result, an adverse effect of a structure such as the teeth 51 of the stator and the winding 52 on a direction of an angle of rotation looks nullified.

A rotational position of the rotor at which variables representing operating points of elements of a permanent magnet simultaneously take on maximum values does not normally exist. However, when an operating point shifts beyond a knickpoint even instantaneously, demagnetization occurs. Therefore, a method of assigning a maximum value of a variable representing an operating point to each of the elements and displaying the operating points of the elements as shown in FIG. 12 is quite advantageous in practice. In an example to be described below, an operating point represented by a maximum value of a variable representing an operating point is adopted as an operating point and used for display. A certain part of the permanent magnet 54 being noted, when a negative magnetic field at the operating point gets larger than a negative magnetic field at a knickpoint while the rotor is rotated, the part of the permanent magnet is demagnetized. Therefore, whether the permanent magnet 54 is demagnetized can be decided based on whichever of a maximum value a variable representing an operating point of each element takes on during the rotation of the rotor and a value of a variable representing an operation point coincident with a knickpoint is larger.

Figure 13:
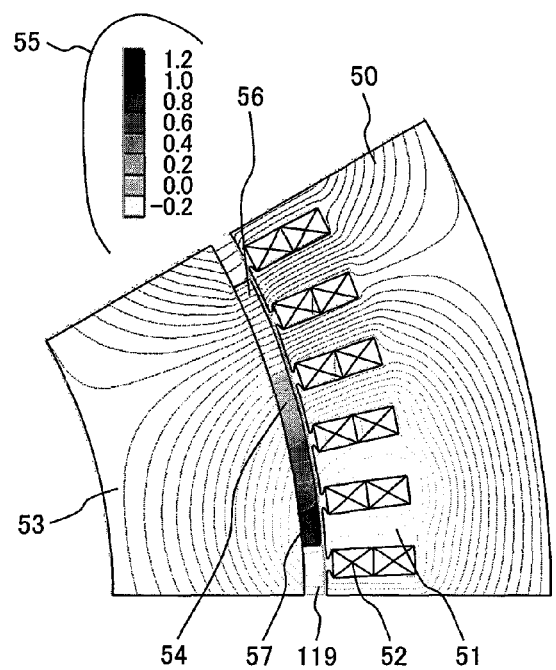
FIG. 13 is a diagram showing a zone contour base on the operating points on the permanent magnet on the basis of a result of electromagnetic field analysis of the motor in a case where a phase angle of a conducting current is 0°, a counterclockwise torque is exerted in the rotor, and the rotor is located at the illustrated position in the fifth embodiment.
Figure 14:
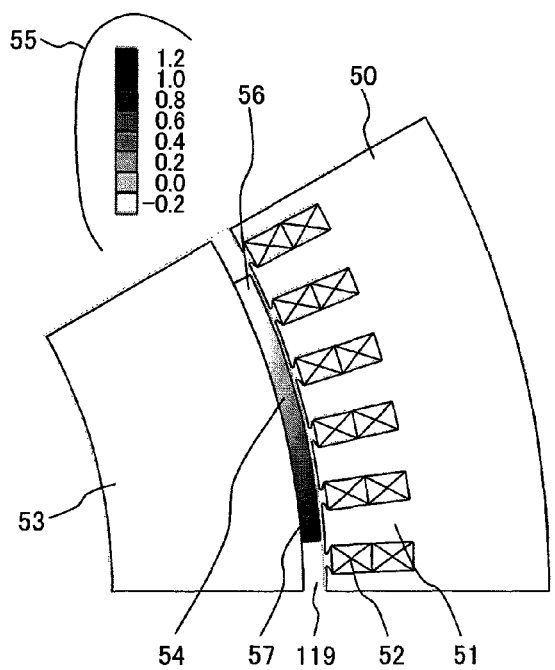
FIG. 14 is a diagram showing a zone contour based on the operating points on the permanent magnet on the basis of a result of electromagnetic field analysis of the motor in a case where the phase angle of the conducting current is 0°, a counterclockwise torque is exerted in the rotor, and the rotor is rotated in the fifth embodiment.

FIG. 13 and FIG. 14 show a state in which a conducting current of 500 amperes is conducted to a winding 52 of an SPMSM shown in FIG. 11 and a counterclockwise torque that is counterclockwise in the sheet of paper of the drawing is exerted in the rotor, that is, a state in which a load is imposed. A phase angle of the conducting current is 0°. The relationship between FIG. 13 and FIG. 14 is identical to that between FIG. 11 and FIG. 12. Namely, FIG. 13 shows a result of calculation performed when the stator core 50 and rotor core 53 have the positional relationship shown in the drawing, while FIG. 14 shows a result of calculation performed by rotating the rotor.

When FIG. 13 and FIG. 14 are compared with FIG. 11 and FIG. 12, variables representing operating points get larger as a whole. In addition, a spatial distribution in a rotating direction is observed in the permanent magnet 54. A region 57 is located on a so-called demagnetization side. Compared with a region 56 located on a so-called magnetization side, the values of the variables representing operating points are larger as a whole. In the present embodiment, the larger the value of a variable representing an operating point is, the higher a possibility that the operating point shifts beyond a knickpoint to bring about demagnetization is. In addition, in a corner part of the magnet on the side of the gap of the magnet, the values of the variables representing the operating points are larger.

Figure 15:
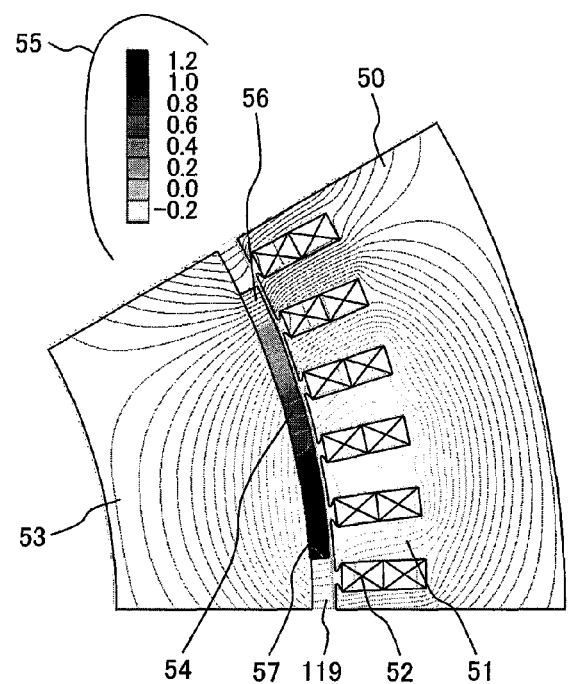
FIG. 15 is a diagram showing a zone contour base on the operating points on the permanent magnet on the basis of a result of electromagnetic field analysis of the motor in a case where the phase angle of the conducting current is 40°, a counterclockwise torque is exerted in the rotor, and the rotor is located at the illustrated position in the fifth embodiment.
Figure 16:
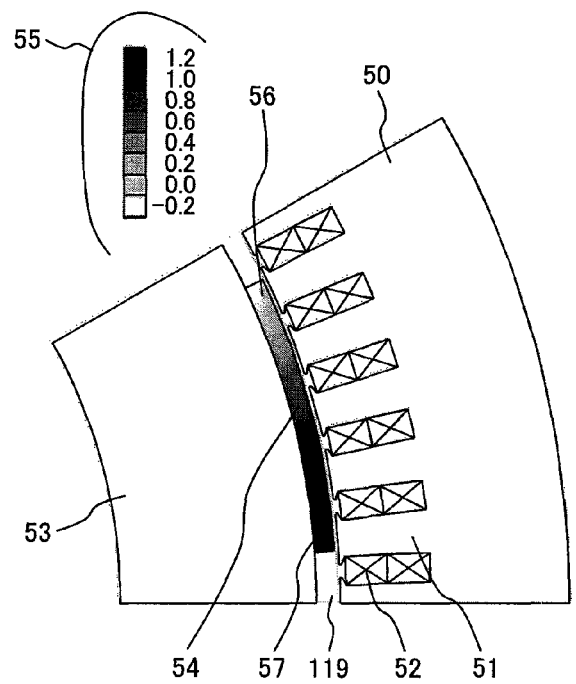
FIG. 16 is a diagram showing a zone contour based on the operating points on the permanent magnet on the basis of a result of electromagnetic field analysis of the motor in a case where the phase angle of the conducting current is 40°, a counterclockwise torque is exerted in the rotor, and the rotor is rotated in the fifth embodiment.

FIG. 15 and FIG. 16 show a case where a phase angle of a conducting current is 40°. The value of the conducting current is 500 amperes. When the phase angle of the conducting current changes, a spatial distribution of variables representing operating points in the permanent magnet 54 changes in the magnet 54 in such a manner that the values of the variables get larger as a whole. A possibility of demagnetization gets higher.

As mentioned above, variables representing operating points are obtained as shown in FIG. 7 or FIG. 9. A zone contour concerning the variables representing the operating points is displayed on a permanent magnet as a result of analysis. Irrespective of whether the operating points lie in any of the first, second, and third quadrants of a B-H curve, the distribution of the operating points can be continuously expressed. This proves very useful in design of a motor that is not demagnetized. Normally, a result of electromagnetic field analysis is displayed in the form of a zone contour that expresses magnetic flux densities with lines (a zone contour linearly varies depending on a magnetic flux density). As mentioned above, an operating point of a permanent magnet is determined with a magnetic field H and a magnetic flux density B. Therefore, since it is generally adopted to display a result of analysis based on the finite element method in the form of a zone contour expressing magnetic flux densities with lines, it may be natural to depict, like in the present embodiment, the zone contour using lines that indicate variables representing operating points. A relationship to a distribution of magnetic flux lines, a distribution of magnetic flux densities, or a distribution of magnetic fields can be quantitatively readily grasped.

In the foregoing fifth embodiment, an example of a method for depicting a spatial distribution of variables, which represent operating points, in a magnet has been presented. The method proves effective in grasping part of a permanent magnet that has a high possibility of demagnetization.

Supposing a variable representing an operating point exceeds a value at a knickpoint, a ratio at which part of a magnet whose operating point is represented by the variable exceeding the value at the knickpoint occupies the entire magnet has to be accurately learned. A method for more quantitatively expressing a distribution in a permanent magnet of variables, which represent operating points in the permanent magnet, will be described in relation to an embodiment below.

Sixth Embodiment

Figure 17:
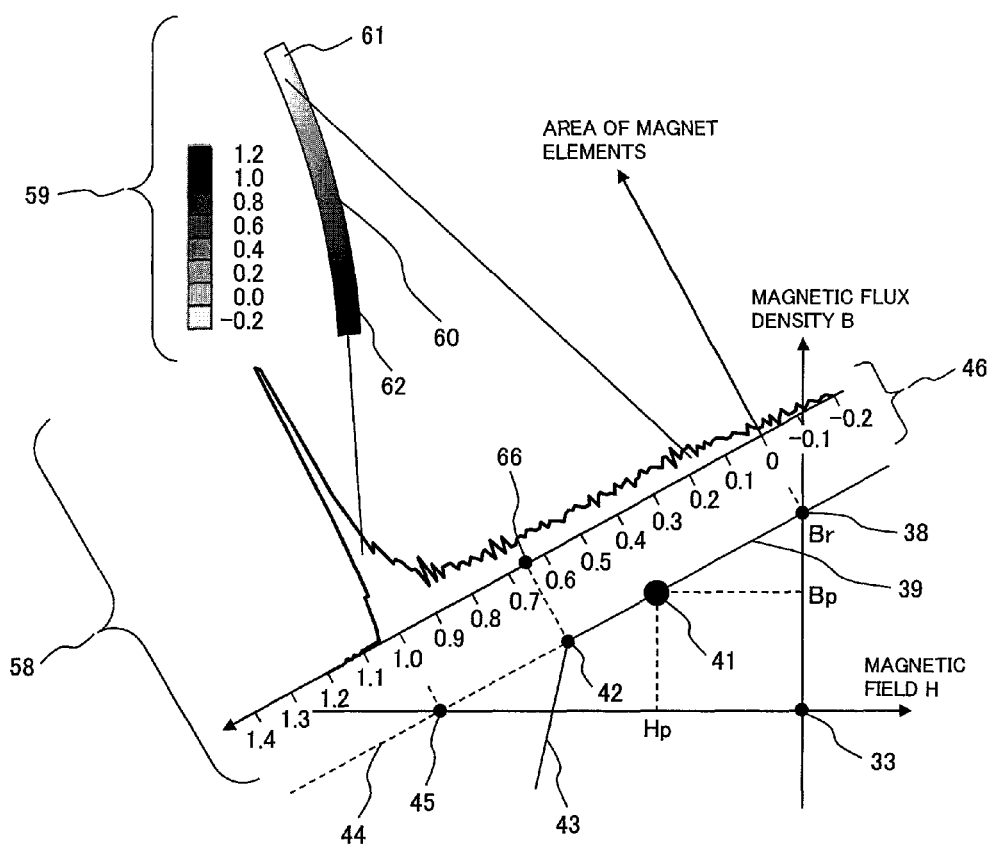
FIG. 17 is a diagram showing a method for analyzing operating points of the permanent magnet in a sixth embodiment of the present invention.

FIG. 17 schematically shows another analysis method for a position on a B-H curve of a permanent magnet, that is, an operating point in accordance with an embodiment of the method for analyzing operating points of a permanent magnet of the present invention, and a result of display performed by a program in which the analysis method is implemented. The definitions of a demagnetization curve of the permanent magnet and the operating point are identical to those shown in FIG. 9.

In FIG. 17, a histogram 58 is plotted. In the histogram 58, the horizontal axis indicates a variable 46 representing an operating point, and the vertical axis indicates an area of magnet elements whose operating points are represented by the variable 46. In the aforesaid embodiments, a result of calculation based on two-dimensional magnetic field analysis performed on a section of a motor is displayed. In the histogram 58, the area of magnet elements is indicated on the vertical axis. When a result of three-dimensional magnetic field analysis is used, the vertical axis for the histogram 58 indicates a volume of magnet elements.

A histogram that is a frequency distribution graph often indicates the number of data items in each class with the height of a bar or rectangle. In the present embodiment and subsequent embodiments, broken lines which link the apices of the bars serve to substitute for the bars since the number of classes is so large that indication using bars makes it hard to discern one bar from another.

FIG. 17 is a conceptual diagram in which a demagnetization curve (straight line portions 39 and 43 of the demagnetization curve), the variable 46 representing an operating point, and the histogram 58 are plotted in the same sheet of paper for a better understanding. The histogram 58 becomes easier to understand when normalized so that an integrated value comes to 100.

For reference, FIG. 17 shows an example of a zone contour 59 of the permanent magnet 60 depicted based on the values of the variable 46 representing an operating point. A portion of the histogram 58 in which the variable 46 representing an operating point takes on small values is equivalent to an area 61 in the zone contour 59 having light gray tones. A portion of the histogram in which the variable 46 representing an operating point takes on large values is equivalent to an area 62 in the zone contour 59 having dark gray tones. Assuming that Hp denotes a magnetic field at an operating point 41 and Bp denotes a magnetic flux density thereat, the variable representing the operating point 41 is written as $$1 - \frac{Bp}{Br}. \tag{22}$$

An embodiment employing a histogram plotted as mentioned above will be described below.

Seventh Embodiment

Figure 18:
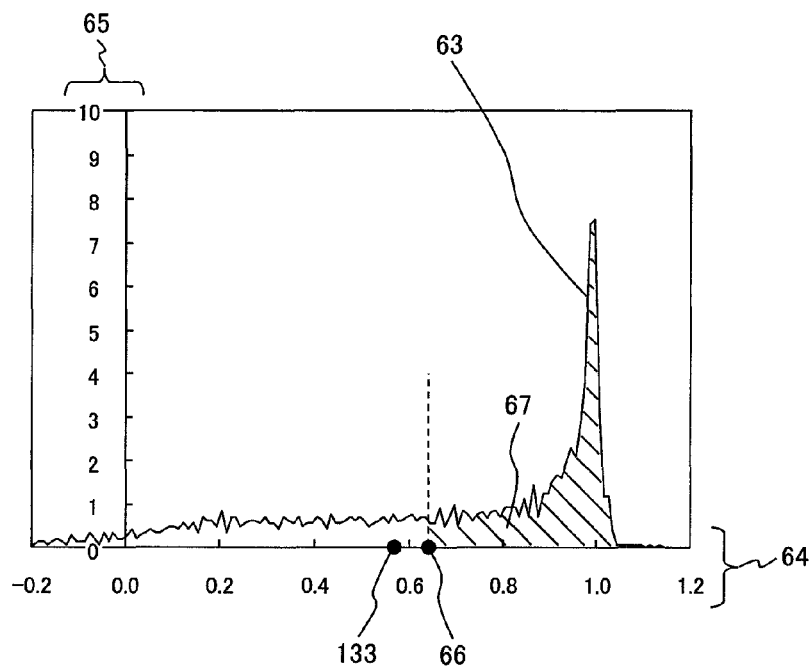
FIG. 18 is a diagram showing a histogram concerning the permanent magnet in a method for analyzing operating points of the permanent magnet in a seventh embodiment of the present invention.

FIG. 18 shows another analysis method for a position on a B-H curve of a permanent magnet, that is, an operating point in accordance with an embodiment of the method for analyzing operating points of a permanent magnet of the present invention, and a result of display performed by a program in which the analysis method is implemented. In FIG. 18, a histogram 63 of a permanent magnet 54 is plotted based on the results of analysis and display shown in FIG. 16.

In the histogram 63, the horizontal axis indicates a variable 64 representing an operating point of a permanent magnet, and the vertical axis indicates a histogram value 65. More specifically, the variable 64 representing an operating point is graduated at steps of 0.01. Mesh elements of the permanent magnet represented by variables that fall in a range of certain values, for example, 0.02±0.005 are selected, and an area occupied by the elements is indicated with the histogram value 65 of 0.02. Finally, the histogram values 65 are normalized so that the sum thereof becomes 100. Thus, when the variable 64 representing an operating point is expressed linearly, the histogram 63 indicating an area in the magnet can be, as shown in FIG. 17, seen while being superposed on a demagnetization curve. This makes it easier to understand a quantitative relationship between a result of electromagnetic field analysis and a histogram of operating points.

In the present embodiment, the variable 64 representing an operating point is successively defined to exceed 0.0 and 1.0 (to range from a value equal to or smaller than 0.0 to a value equal to or larger than 1.0). In particular, some magnet element is equivalent to a domain in which the variable 64 representing an operating point exceeds 1.0. The histogram 63 continuously extends beyond the value of 1.0 of the variable representing an operating point. As mentioned above, an operating point is physically continuously shifted in the second and third quadrants along a B-H curve. Accordingly, the histogram should be continuously defined. In the present embodiment, the histogram 63 is continuously extended. The advantage of the present invention is shown.

Assuming that a demagnetization curve of a permanent magnet based on electromagnetic field analysis includes the straight line portions 39 and 43 of a demagnetization curve shown in FIG. 17, a value 66 which the variable 64 representing an operating point (variable 46 in FIG. 17) takes on at a knickpoint 42 is 0.65 (see FIG. 17 and FIG. 18).

The histogram 63 shown in FIG. 18 is divided into two domains, and one of the domains is a domain 67 (hatched area in FIG. 18) in which the variable 64 representing an operating point of a magnet takes on values exceeding the value at the knickpoint (point of the value 66). The domain 67 is a domain defined by operating points associated with larger absolute values of magnetic fields than the value 66 at the knickpoint 42, that is, in the present embodiment, a domain in which a value at any operating point is larger than the value 66 at the knickpoint 42. Therefore, a fact that part of the permanent magnet equivalent to the domain 67 is demagnetized can be quantitatively grasped from the histogram 63. In addition, by referencing the zone contour depicted using a variable representing an operating point shown in FIG. 16, a spatial place in which demagnetization occurs can be grasped.

In the histogram 63 of the permanent magnet shown in FIG. 18, an operating point associated with a value of an intrinsic coercive force iHc of the permanent magnet may be marked on the horizontal axis. The operating point associated with the value of the intrinsic coercive force iHc is marked in the same manner as an operating point coincident with a knickpoint (point of the value 66). In this case, part of the permanent magnet associated with a domain in which the variable 64 representing an operating point exceeds the value of the intrinsic coercive force iHc is demagnetized.

In actual design of electromagnetic equipment, a safety factor is often designated with respect to a knickpoint. For this purpose, for example, if the horizontal axis in a histogram indicates a value 133 at an operating point a user arbitrarily designates, it would be found useful. The value 133 at the operating point is a value obtained by calculating a safety factor of 0.1, which is a value of a variable representing an operating point, into the value 66 at the knickpoint. In this case, if the histogram includes a domain defined by operating points associated with larger absolute values of magnetic fields than the value 133 at the operating point, that is, a domain in which a value at any operating point is larger than the value 133 at the operating point, there is a possibility that part of a permanent magnet associated with the domain may be demagnetized. Thus, design can be achieved in expectation of the safety factor.

As an arbitrarily designated operating point, a user can designate one or plural operating points. Thus, for example, how a domain associated with part of a permanent magnet that is demagnetized changes along with a change in a safety factor can be checked. This increases usefulness in design of electromagnetic equipment.

Figure 43:
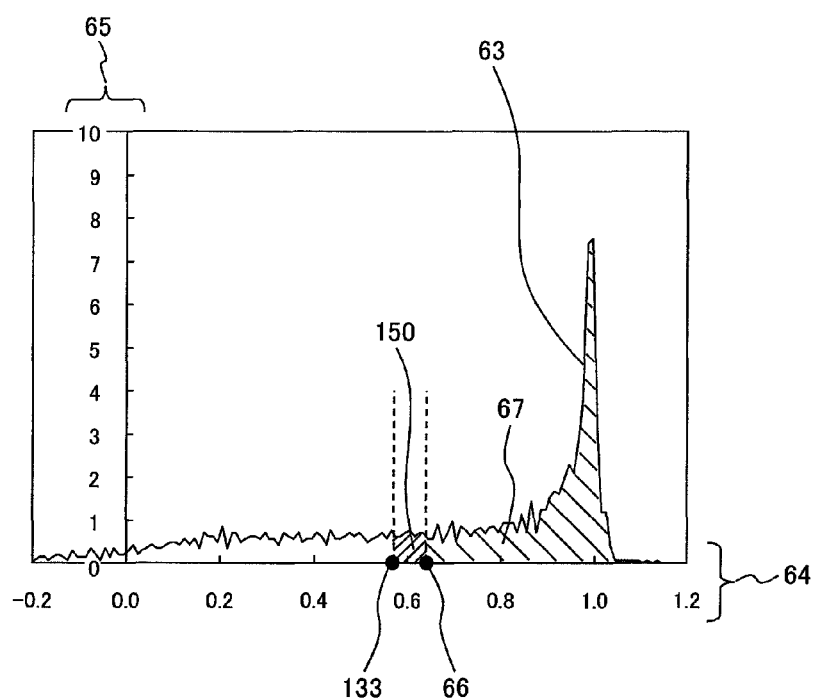
FIG. 43 is a diagram showing a histogram, which is divided into three domains, concerning the permanent magnet in a method for analyzing operating points of the permanent magnet in the seventh embodiment.

FIG. 43 is a diagram showing a histogram 63 of a permanent magnet 54 employed, similarly to the histogram 63 shown in FIG. 18, in the present embodiment. The histogram 63 is divided into three domains. One of the domains is the domain 67 shown in FIG. 18, and another domain is a domain 150 in which a variable 64 representing an operating point exceeds the value 133 at the operating point a user has arbitrarily designated. The domain 150 is a domain in which an absolute value of a magnetic field associated with an operating point is larger than the value 133 at the operating point the user has arbitrarily designated, that is, in the present embodiment, a domain in which a value at an operating point is larger than the value 133 at the operating point the user has arbitrarily designated. However, the domain 150 does not include a domain overlapping the domain 67.

As described above and shown in FIG. 18 and FIG. 43, the histogram 63 makes it possible to mark on the horizontal axis at least one of an operating point coincident with a knickpoint, an operating point at which an intrinsic coercive force iHc is indicated, one or plural operating points a user has arbitrarily designated. Further, with the value of the marked operating point as a border, the histogram 63 can be divided into plural domains. Further, a sum of values in at least one of the resultant domains of the histogram can be calculated and displayed as a domain associated with part of a permanent magnet that is irreversibly demagnetized.

Figure 40:
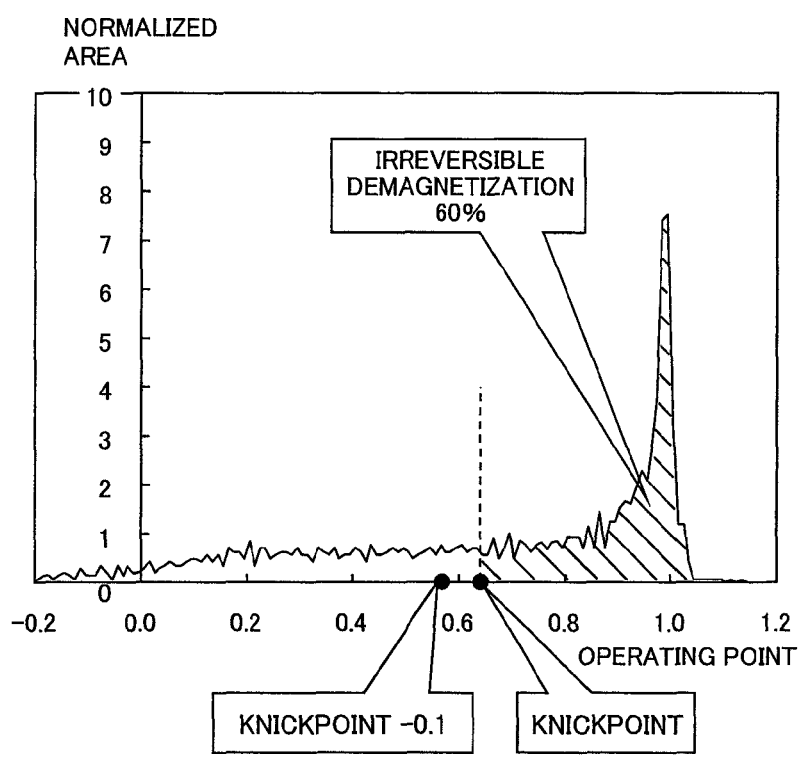
FIG. 40 is a diagram showing an example of a histogram for a design in consideration of a safety factor.

FIG. 40 is a diagram showing an example of display of the histogram shown in FIG. 18 which is presented to a user in order to help the user achieve design in consideration of a safety factor. In the histogram, a knickpoint, an operating point obtained in consideration of the safety factor, and a ratio of an irreversible demagnetization domain are indicated.

Further, other embodiments of the present invention intended to accurately learn an area of the domain 67 (ratio of an irreversible demagnetization domain) will be described below.

Eighth Embodiment

Figure 19:
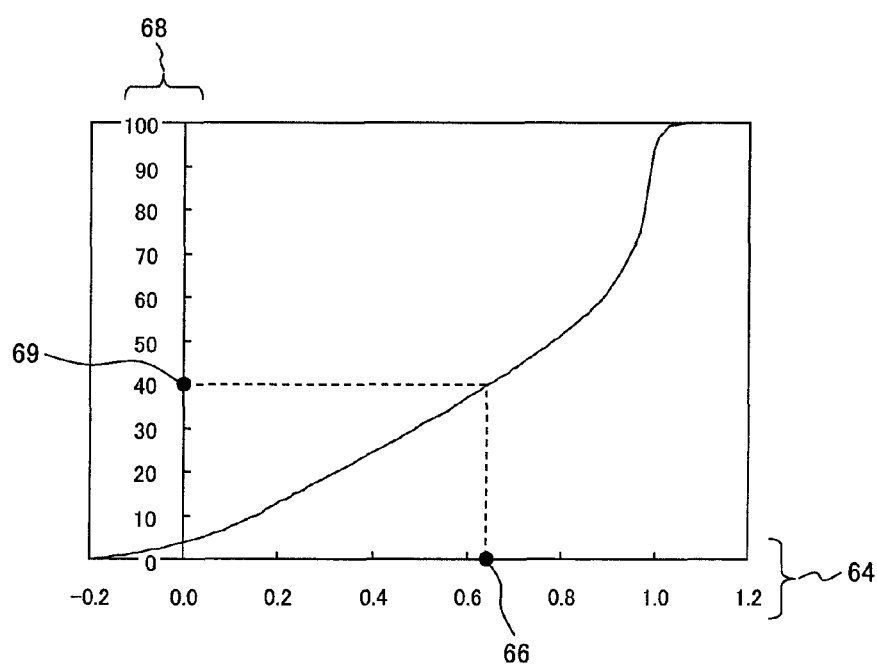
FIG. 19 is a diagram showing a histogram of integrated values concerning the permanent magnet in a method for analyzing operating points of the permanent magnet in an eighth embodiment of the present invention.

FIG. 19 shows another analysis method for a position on a B-H curve of a permanent magnet, that is, an operating point in accordance with an embodiment of the method for analyzing operating points of a permanent magnet of the present invention, and a result of display performed by a program in which the analysis method is implemented. FIG. 19 is based on a result of electromagnetic field analysis and a result of calculation of variables representing operating points which are identical to those shown in FIG. 18.

In FIG. 19, the horizontal axis indicates a variable 64 representing an operating point of a permanent magnet, and the vertical axis provides histogram values 68. More specifically, for example, a value 69 on the vertical axis relating to a value 66 at a knickpoint of the variable 64, which represents an operating point, is a value obtained by integrating histogram values that relate to values on the horizontal axis ranging from a negative infinite value to the value 66 at the knickpoint (a sum of histogram values). Further, in order to facilitate evaluation, a maximum value on the vertical axis in FIG. 19, that is, a value obtained by integrating histogram values that relate to values on the horizontal axis in FIG. 18 ranging from a negative infinite value to a positive infinite value is normalized to be 100.0.

In the histogram in which such integrated values or values resulting from integration as those employed in the present embodiment are marked on the vertical axis, in FIG. 19, the value 69 on the vertical axis is 40. At this time, the area of the domain 67 in FIG. 18 is calculated as 100−40=60. Namely, in this case, an area of part of a permanent magnet that is demagnetized because a variable representing an operating point exceeds the value at the knickpoint is quantitatively learned to be 60% of the entire area of the permanent magnet. The fact that the ratio of an irreversible demagnetization domain is 60% as shown in FIG. 40 can be accurately obtained in the foregoing method.

Ninth Embodiment

Figure 20:
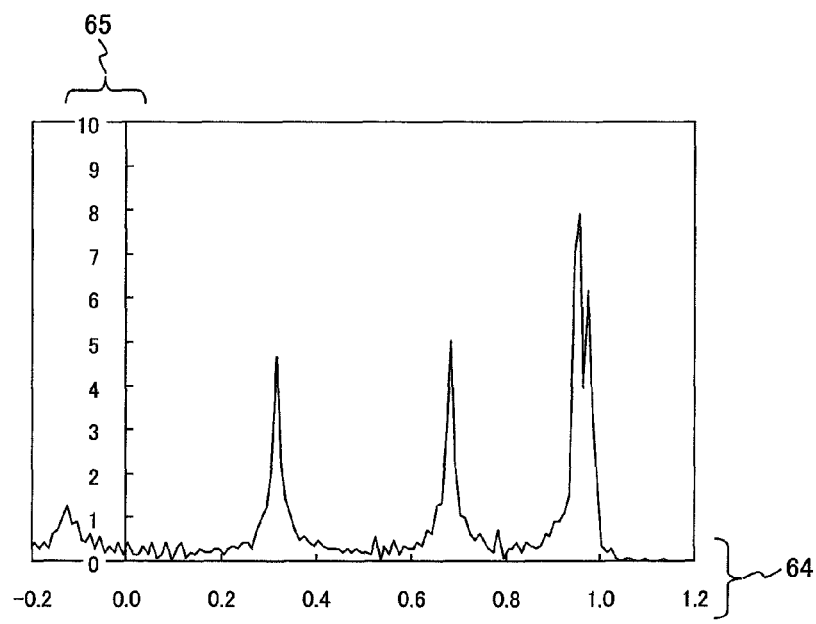
FIG. 20 is a diagram showing a histogram concerning the permanent magnet in a method for analyzing operating points of the permanent magnet in a ninth embodiment of the present invention.

FIG. 20 shows another analysis method for a position on a B-H curve of a permanent magnet, that is, an operating point in accordance with an embodiment of the method for analyzing operating points of a permanent magnet of the present invention, and a result of display performed by a program in which the analysis method is implemented. The present embodiment calculates a variable representing an operating point of a permanent magnet on the basis of a result of electromagnetic field analysis shown in FIG. 13, and plots a histogram indicating an associated area in the magnet. Specifically, the same method as the method for plotting the histogram shown in FIG. 18 on the basis of the result shown in FIG. 14 is used to plot a histogram shown in FIG. 20.

A motor shown in FIG. 13 is an SPMSM. Therefore, a distribution of magnetic fields H and magnetic flux densities B in a permanent magnet 54 is susceptible to a structure of a stator such as a shape of teeth 51 or a pitch thereof. In FIG. 13, shades of a zone contour are distributed while being affected by the teeth 51. Accordingly, the histogram shown in FIG. 20 has plural peaks.

In the histogram shown in FIG. 18, as seen from the plotting method, plural peaks depending on a structure of a stator and associated with specific rotational positions of a rotor are hardly observed. In an interior permanent magnet synchronous motor (IPMSM), a permanent magnet is located at a deep position apart from the surface of a rotor on an air gap side thereof, though it is not described in relation to the present embodiment. Therefore, the permanent magnet in the IPMSM is, compared with that in the SPMSM, unsusceptible to the structure of a stator and specific rotational positions of the rotor. Therefore, histograms plotted according to the same plotting methods as those employed in FIG. 18 and FIG. 20 are more analogous to each other than those of the SPMSM.

Tenth Embodiment

Figure 21:
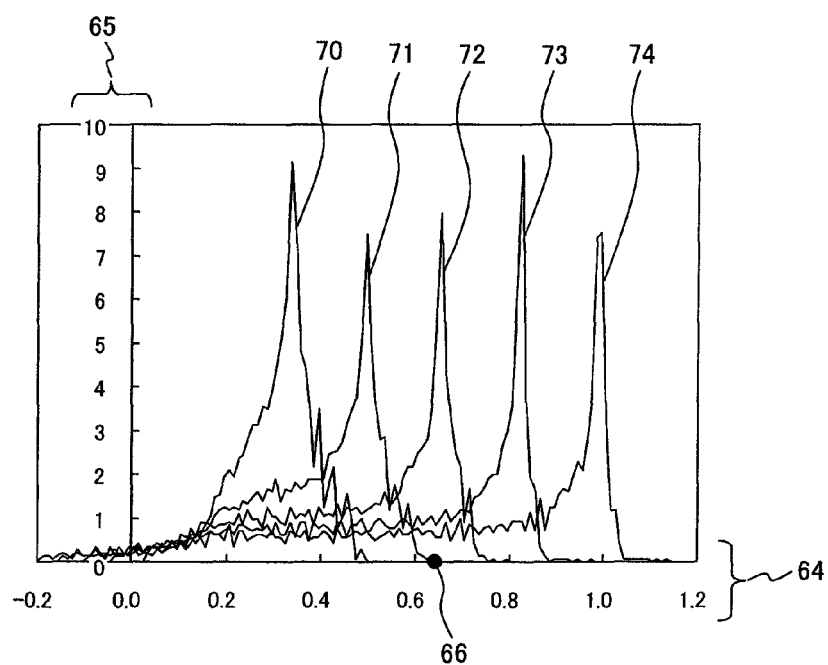
FIG. 21 is a diagram showing histograms concerning the permanent magnet in a method for analyzing operating points of the permanent magnet in a tenth embodiment of the present invention.

FIG. 21 shows another analysis method for a position on a B-H curve of a permanent magnet, that is, an operating point in accordance with an embodiment of the method for analyzing operating points of a permanent magnet of the present invention, and a result of display performed by a program in which the analysis method is implemented.

Histograms shown in FIG. 21 are included in a graph by gathering results of calculation of variables, which represent operating points in a permanent magnet, on the basis of the results of electromagnetic field analysis, which is performed by changing a conducting current to be conducted to the motor shown in FIG. 11 to FIG. 16. Histograms 70, 71, 72, 73, and 74 indicate results obtained when the conducting current is 100 amperes, 200 amperes, 300 amperes, 400 amperes, and 500 amperes respectively. The phase angle of the conducting current is set to 40° for all the ampere values.

In FIG. 21, a value 66 at a knickpoint that is a value of a variable 64 representing an operating point is, similarly to the one in FIG. 18, 0.65. Since the histograms 70 and 71 have no area in a domain in which the variable 64 representing an operating point takes on values equal to or larger than the value 66 at the knickpoint, when the conducting current is equal to or smaller than 200 amperes, a decision can be made that a permanent magnet is not demagnetized. In contrast, the histograms 72, 73, and 74 have an area in the domain in which the variable 64 representing an operating point takes on the values equal to or larger than the value 66 at the knickpoint. Therefore, it is quantitatively understood that when the conducting current is equal to or larger than 300 amperes, the permanent magnet is partly demagnetized.

Figure 22:
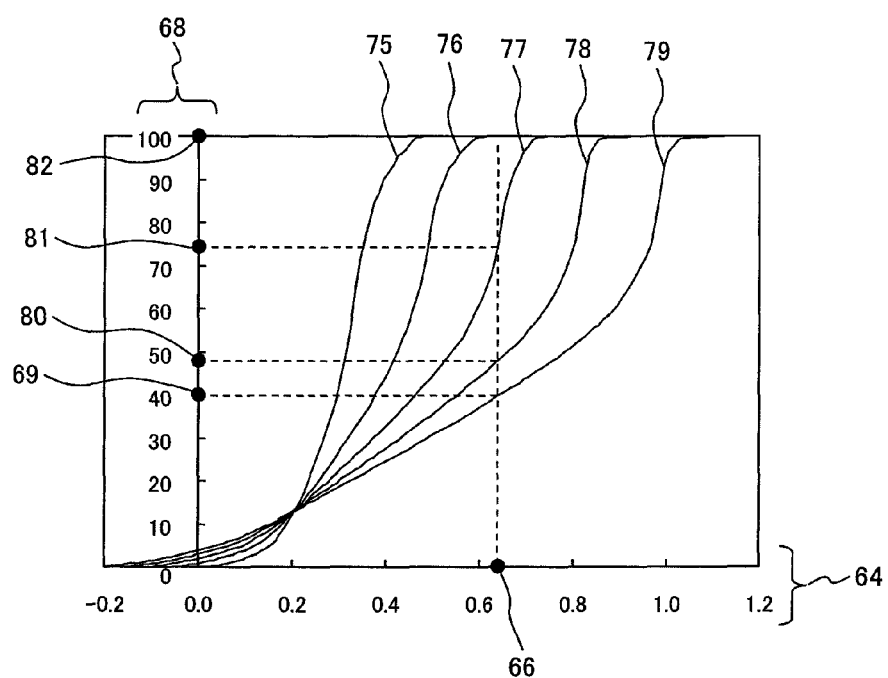
FIG. 22 is a diagram showing the results of calculation in the form of histograms whose integrated values are indicated on the vertical axis in the tenth embodiment.

FIG. 22 shows an example in which the same results of calculations as those shown in FIG. 21 are expressed by histograms for which the vertical axis provides integrated values or values obtained through integration. A relationship between FIG. 21 and FIG. 22 is identical to the relationship between FIG. 18 and FIG. 19. Histograms 75, 76, 77, 78, and 79 shown in FIG. 22 and derived from integration are associated with the histograms 70, 71, 72, 73, and 74 shown in FIG. 21. An integrated histogram value 68 relating to the value 66 at the knickpoint that is a value of the variable 64 representing an operating point is a value at a point 82, 82, 81, 80, or 69, that is, 100.0, 100.0, 74.0, 48.0, or 40.0 indicated by the histogram 75, 76, 77, 78, or 79.

As a result, it is quantitatively understood that, when a conducting current is 100 amperes or 200 amperes, a value at an operating point of every part of a permanent magnet is smaller than the value at the knickpoint. In addition, it is quantitatively understood that, when the conducting current is 300 amperes, 400 amperes, or 500 amperes, an area of part of the permanent magnet whose operating point is represented by a value smaller than the value at the knickpoint occupies 74.0%, 48.0%, or 40.0% of the entire area of the permanent magnet. In other words, it is quantitatively clearly understood that when the conducting current is 300 amperes, 400 amperes, or 500 amperes, part of the permanent magnet that occupies 26.0% (100.0−74.0), 52.0% (100.0−48.0), or 60.0% (100.0−40.0) of the entire permanent magnet is demagnetized. This has, as mentioned above, a quite significant meaning in research, development, and design of electromagnetic equipment including a permanent magnet.

In the aforesaid embodiments, examples in which the present invention is applied to two-dimensional electromagnetic field analysis have been presented. Naturally, the present invention can be applied to three-dimensional electromagnetic field analysis. An embodiment in which the present invention is applied to three-dimensional electromagnetic field analysis will be described below.

Eleventh Embodiment

Figure 23:
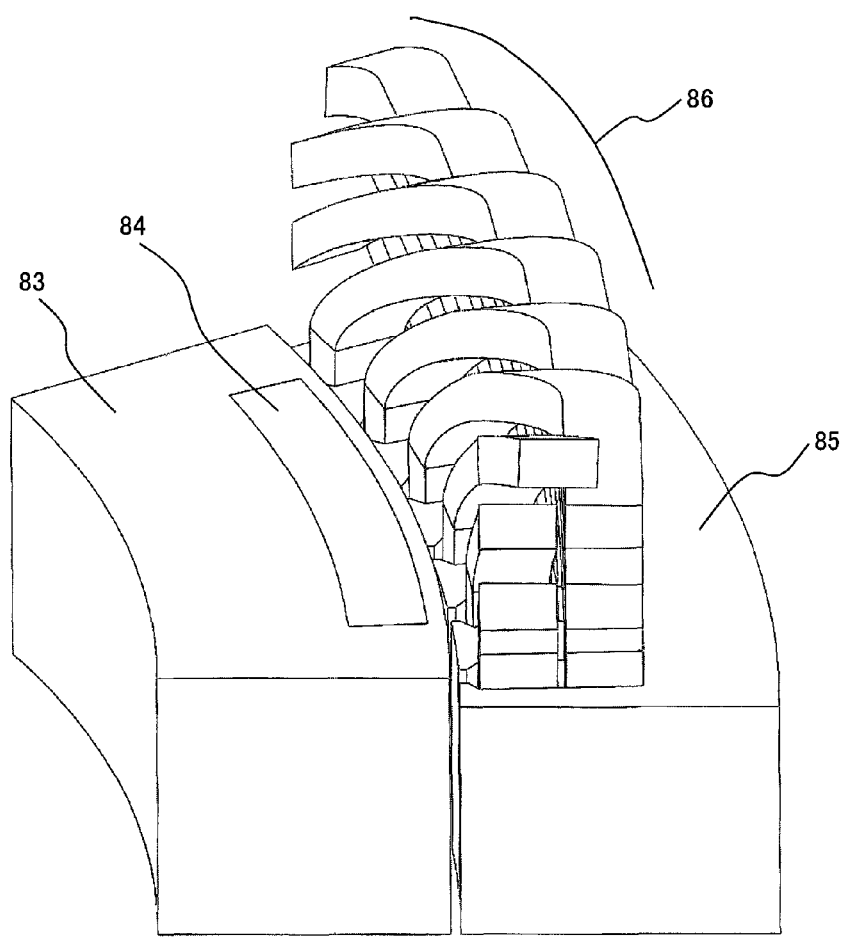
FIG. 23 is a diagram showing a model of one pole part of a magnet incorporated in an IPMSM in an eleventh embodiment of the present invention.

FIG. 23 is a diagram showing a model of a pole part of an IPMSM employed in the present embodiment. FIG. 23 shows a portion obtained by cutting the magnet on a center thereof in an axial direction so that the length in the axial direction thereof can be halved.

A permanent magnet 84 is embedded in a rotor core 83. A winding 86 is wound about a stator core 85 in a distributed winding manner. The permanent magnet 84 is a typical Nd magnet, the remanent magnetic flux density thereof is 1.1 tesla, and the recoil permeability is 1.025 times larger than a permeability in a vacuum. In addition, the permanent magnet 84 is of a so-called radial magnetization type, and the direction of the remanent magnetic flux density is a radial direction. A conducting current is 300 amperes, and the phase angle of the conducting current is 40.0°.

Figure 24:
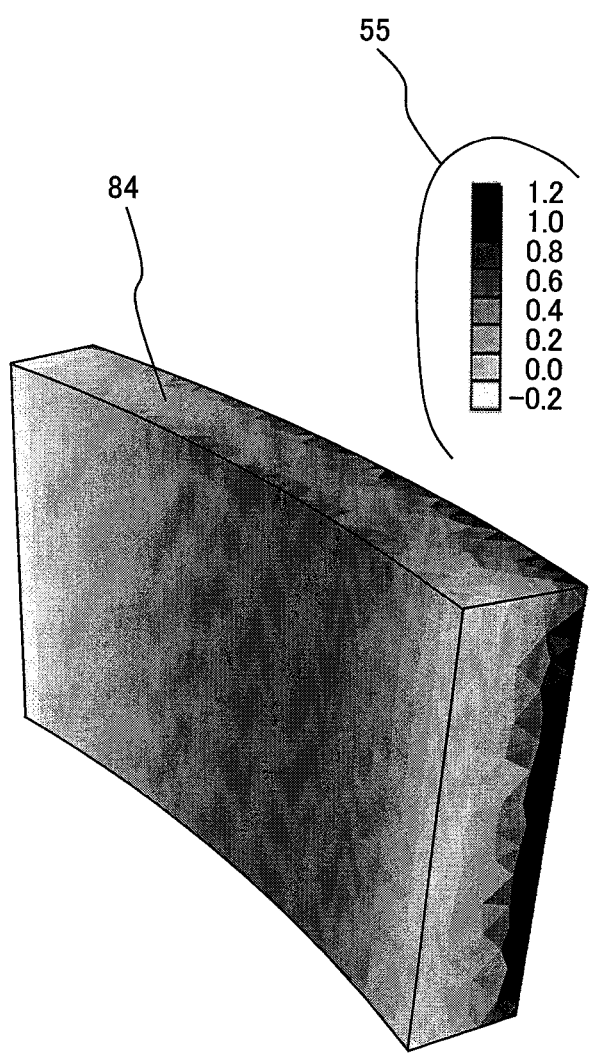
FIG. 24 is a diagram showing a zone contour based on the operating points on the permanent magnet in the eleventh embodiment (a diagram showing the permanent magnet from an internal side thereof in a radial direction)
Figure 25:
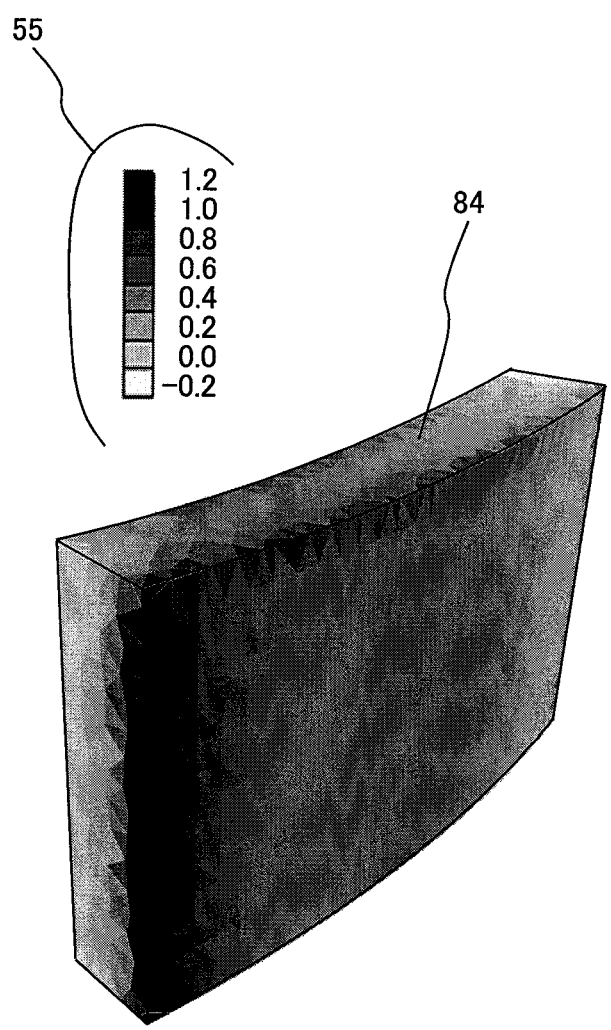
FIG. 25 is a diagram showing the zone contour based on the operating points on the permanent magnet in the eleventh embodiment (a diagram showing the permanent magnet from an external side thereof in the radial direction)

FIG. 24 and FIG. 25 show results of display of a zone contour on the surface of the permanent magnet 84 by obtaining variables, which represent operating points of respective elements of the permanent magnet 84, on the basis of a result of three-dimensional electromagnetic field analysis performed on the model shown in FIG. 23. FIG. 24 and FIG. 25 show the same permanent magnet 84 seen from an internal side in a radial direction and from an external side in the radial direction respectively. A scale 55 for the zone contour ranges from −0.2 to 1.2. In FIG. 24 and FIG. 25, similarly to FIG. 12, FIG. 14, and FIG. 16, a maximum value of a variable representing an operating point of each of the elements of the permanent magnet is sampled from a result of three-dimensional electromagnetic field analysis performed by rotating the rotor.

Figure 26:
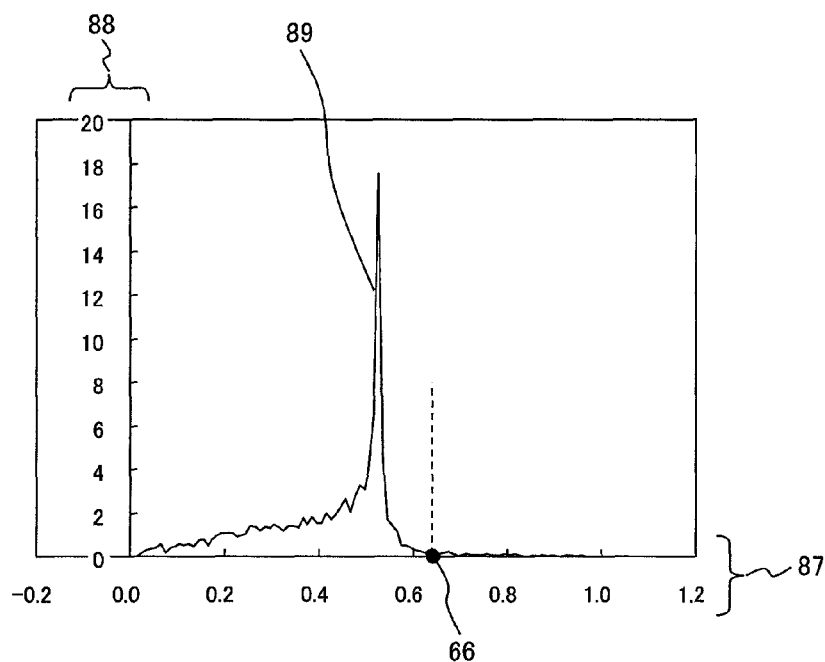
FIG. 26 is a diagram showing a histogram concerning the permanent magnet in the eleventh embodiment.

FIG. 26 shows a result of plotting a histogram 89 according to the same method as the aforesaid one on the basis of results of calculations of variables representing operating points in a permanent magnet shown in FIG. 25. However, in the aforesaid embodiments, a result of two-dimensional electromagnetic field analysis has been presented. Therefore, the histogram and the histogram of integrated values are concerned with an area in the permanent magnet. Since the present embodiment is an example of three-dimensional electromagnetic field analysis, a histogram value 88 is concerned with a volume in the permanent magnet.

Figure 27:
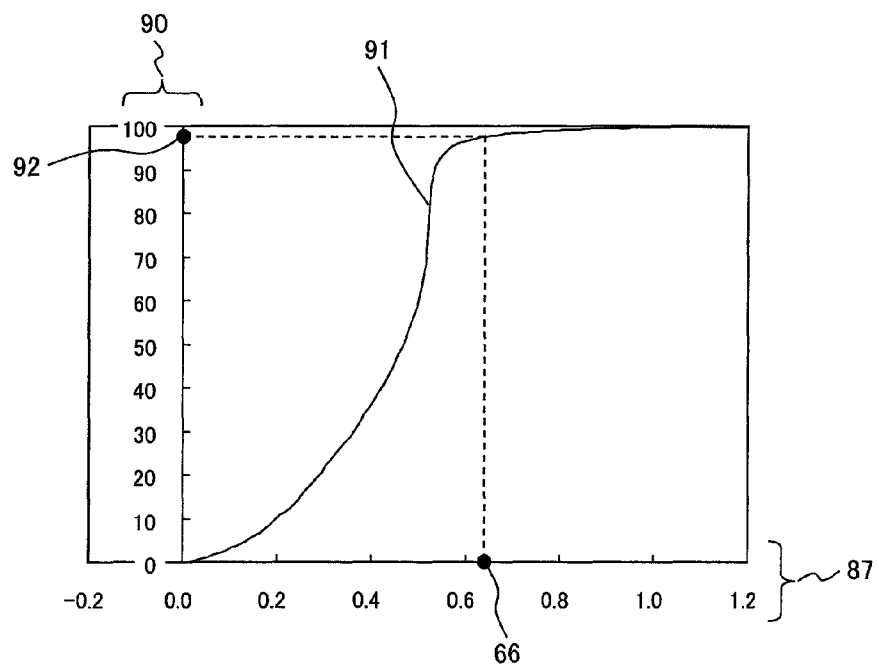
FIG. 27 is a diagram showing a histogram of integrated values concerning the permanent magnet in the eleventh embodiment.

FIG. 27 shows a histogram 91 of integrated values plotted by integrating histogram values indicated by the histogram 89 shown in FIG. 26. The vertical axis of FIG. 27 indicates an integrated histogram value 90 that represents, similarly to the histogram shown in FIG. 26, a volume in the permanent magnet.

In FIG. 26 and FIG. 27, similarly to the aforesaid embodiments, assuming that the value 66 at the knickpoint which is a value of a variable 87 representing an operating point of the permanent magnet 84 is 0.65, it is seen from the histogram 89 shown in FIG. 26 that there is a small part of the permanent magnet whose operating point is represented by a value exceeding the value at the knickpoint. Further, assuming that a value 92 on the vertical axis in FIG. 27 is 98.0, it is quantitatively understood based on the histogram 91 of integrated values, the value 66, and the value 92 on the vertical axis that the volume of the part of the permanent magnet whose operating point is represented by the value exceeding the value at the knickpoint occupies 2.0% (100.0−98.0) of the entire volume of the permanent magnet. Therefore, it is quantitatively understood that the part of the permanent magnet whose volume occupies 2.0% of the entire volume of the permanent magnet is demagnetized.

The aforesaid fifth to eleventh embodiments have introduced examples in which a variable representing an operating point is expressed as shown in FIG. 7 and FIG. 9. In the embodiments, for example, a relationship between an upper limit on the side of a knickpoint in a distribution of operating points and the knickpoint may be converted into a value of the variable representing an operating point, and the value of the variable may be used as a safety factor to perform research, development, and design of a motor. Therefore, an embodiment of the present invention in which a relationship between an operating point and a knickpoint is directly expressed will be described below.

Twelfth Embodiment

Figure 28:
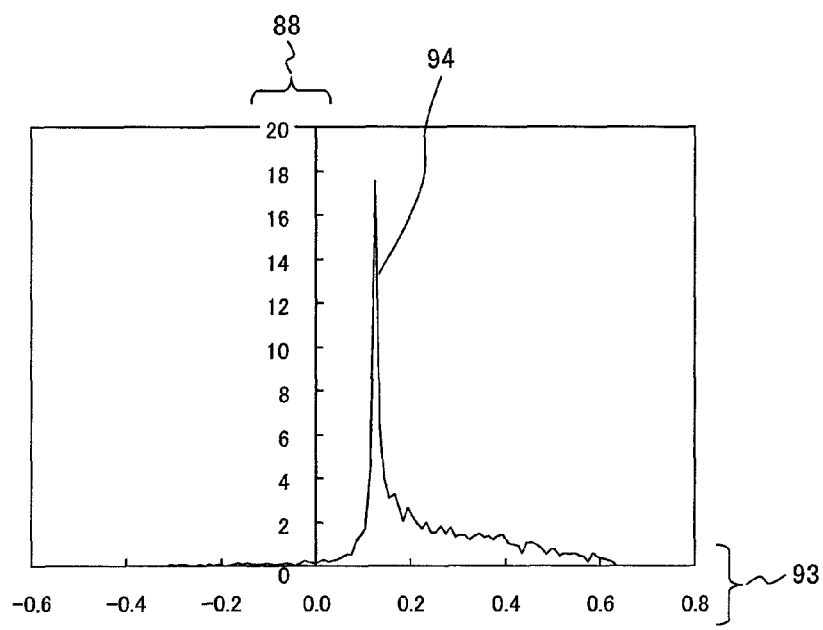
FIG. 28 is a diagram showing a histogram concerning the permanent magnet in a twelfth embodiment of the present invention.

FIG. 28 shows another analysis method for a position on a B-H curve of a permanent magnet, that is, an operating point in accordance with an embodiment of the method for analyzing operating points of a permanent magnet of the present invention, and a result of display performed by a program in which the analysis method is implemented. FIG. 28 shows the same result of calculation based on electromagnetic field analysis as that shown in FIG. 26.

Figure 29:
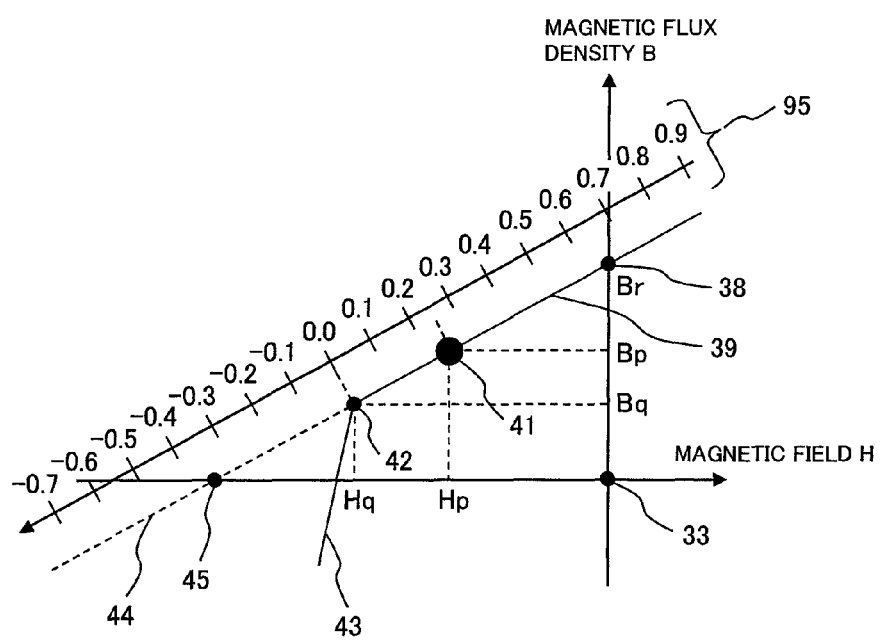
FIG. 29 is a diagram showing a method for analyzing operating points of the permanent magnet in the twelfth embodiment.

In FIG. 28, a variable 93 representing an operating point is an inversion of the horizontal axis in FIG. 26 (variable 87 representing an operating point) obtained with 0.65 that is the value 66 at the knickpoint as an origin. A way of determining the variable 93 representing an operating point is equivalent to a method for defining a variable representing an operating point and being shown in FIG. 29. FIG. 29 will be described later. A value indicated by a histogram 94 is identical to that in FIG. 26.

FIG. 29 is a diagram showing an analysis method for an operating point of a permanent magnet in accordance with the present embodiment. FIG. 29 is identical to FIG. 9 except a definition of a variable 95 representing an operating point. An origin of a scale indicating the variable 95 representing an operating point is defined to coincide with a knickpoint 42 and set to zero. The positive direction of the scale indicating the variable 95 representing an operating point is identical to the positive direction of a magnetic-field H axis. In the present embodiment, the spacing between adjacent readings of the scale indicating the variable 95 representing an operating point is identical to that shown in FIG. 9.

The thus defined variable 95 representing an operating point directly expresses a relationship between an operating point and the knickpoint. Therefore, in the present embodiment, the variable 95 shall be referred to as a knickpoint likelihood. Assuming that Hp denotes a magnetic field at an operating point 41, Bp denotes a magnetic flux density thereat, Hq denotes a magnetic field at the knickpoint 42, and Bq denotes a magnetic flux density thereat, the variable representing the operating point 41 is expressed as $$\frac{Bp - Bq}{Br}. \tag{23}$$

The variable representing the operating point 41 may be defined as $$\frac{Bp - Bq}{Br - Bq}, \tag{24}$$

though this is not illustrated in the present embodiment.

When the variable is defined as the above equation (24), if an operating point lies on a B axis, the value of the variable representing the operating point 41 is 1.0.

Referring back to FIG. 28, the variable 93 representing an operating point is easily regarded as a knickpoint likelihood. Specifically, almost all parts of a permanent magnet are expressed with positive values of the knickpoint likelihood, that is, the variable 93 representing an operating point. A very small part of the permanent magnet is expressed with a negative value, and is therefore demagnetized. This is equivalent to a description of the embodiment shown in FIG. 26. In the present embodiment, the relationship between the variable 93 representing an operating point and the knickpoint is more clearly understood.

Figure 30:
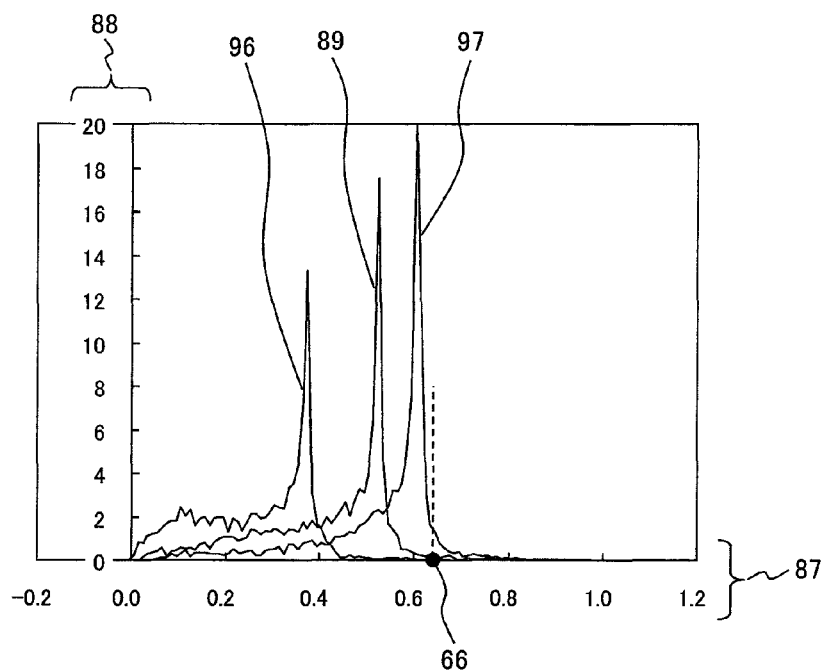
FIG. 30 is a diagram showing histograms concerning a model of one pole part of the magnet incorporated in an IPMSM in a case where the phase angle of a conducting current is changed in the twelfth embodiment.

FIG. 30 shows histograms plotted using the same method as that in FIG. 26 on the basis of results of electromagnetic field analysis performed using the model of the pole part of the IPMSM shown in FIG. 23 under the conditions that a conducting current is set to 300 amperes, and a phase angle of the conducting current is set to 0.0°, 40.0°, and 80.0°. The histograms 96, 89, and 97 are plotted with the phase angle of the conducting current set to 0.0°, 40.0°, and 80.0° respectively.

As seen from FIG. 30, even when the value of the conducting current remains unchanged, if the phase angle thereof increases, a variable 87 representing an operating point takes on larger values as a whole. When the phase angle is 80.0°, a value representing an operating point in part of the permanent magnet exceeds the value 66 at the knickpoint, and the part of the permanent magnet is demagnetized.

Figure 31:
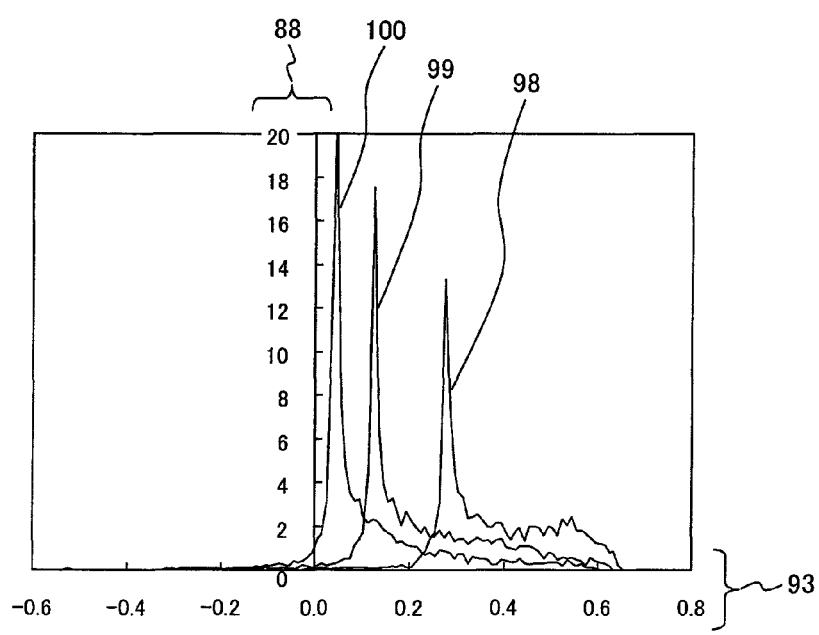
FIG. 31 is a diagram showing other histograms concerning the model of one pole part of the magnet incorporated in the IPMSM in a case where the phase angle of the conducting current is changed in the twelfth embodiment.

FIG. 31 shows histograms plotted according to the same method as that in FIG. 28. The histograms 98, 99, and 100 correspond to the histograms 96, 89, and 97 in FIG. 30. For a better understanding, the horizontal axis 93 is, as mentioned above, regarded as indicating a knickpoint likelihood.

In FIG. 31, the histogram 98 obtained when the phase angle of a current is 0.0° has a likelihood for the value at the knickpoint. The histogram 99 obtained when the phase angle of the current is 40.0° hardly has a likelihood for the value at the knickpoint, though the lower limit thereof is close to the value at the knickpoint. As for the histogram 100 obtained when the phase angle of the current is 80.0°, the lower limit thereof falls below the value at the knickpoint, and part of the permanent magnet is therefore demagnetized. Thus, FIG. 31 is more clearly understood than FIG. 30 is.

According to the present invention, a graph whose vertical axis specifies values obtained by integrating values on the horizontal axis in the histogram shown in FIG. 28 or FIG. 31 can be plotted, though the graph is not shown in relation to the present embodiment. In addition, a zone contour of a permanent magnet to be formed using the variable representing an operating point and being defined as shown in FIG. 29 can be depicted in the same manner as that shown in FIG. 24. The graph and zone contour are easy to understand from the viewpoint of a knickpoint likelihood.

In the aforesaid embodiments, the number of permanent magnets is one. However, the present invention can apply to a case where plural permanent magnets are present in a computational region. For example, a histogram is displayed for each of the permanent magnets or histograms relating to the respective permanent magnets are plotted in one graph.

In the aforesaid embodiments, a demagnetization curve, that is, a B-H curve remains uniform in relation to a permanent magnet.

When the temperature rises, a remanent magnetic flux density B of a permanent magnet and a coercive force generally change. Therefore, when a temperature distribution is observed in the permanent magnet, a consideration should be taken into the fact that a demagnetization curve becomes non-uniform in relation to the permanent magnet. For example, when a manufacturing method of diffusing dysprosium (Dy), which is a heavy rare-earth element, to an Nd magnet is adopted, a distribution may occur in a Dy concentration in the permanent magnet. Therefore, the necessity of taking account of the fact that the demagnetization curve becomes non-uniform in relation to the permanent magnet arises. An embodiment of the present invention coping with a case where a demagnetization curve becomes non-uniform in relation to one permanent magnet, and plural demagnetization curves are distributed in relation to the one permanent magnet will be described below.

Thirteenth Embodiment

Figure 32:
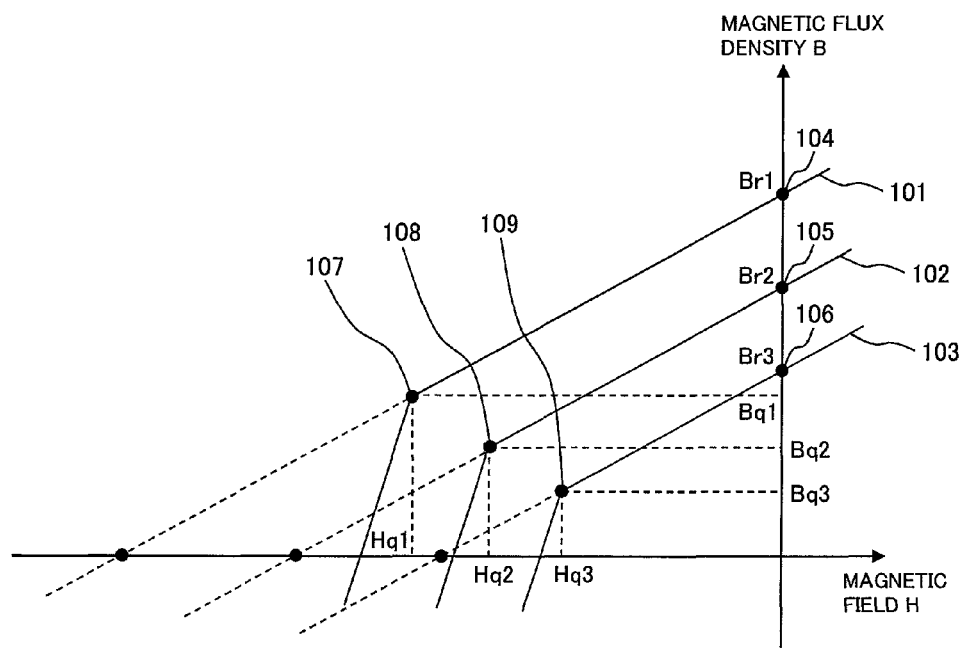
FIG. 32 is a diagram showing an example of plural demagnetization curves distributed in one permanent magnet in a thirteenth embodiment of the present invention.

FIG. 32 shows an example of plural demagnetization curves distributed in relation to one permanent magnet. FIG. 32 shows an example in which the demagnetization curves are distributed along with a temperature distribution in the permanent magnet. Specifically, the characteristic of the permanent magnet is expressed by plural B-H curves. In this case, a B-H curve characterizing each of elements into which the permanent magnet is divided is used to obtain an operating point of each of the elements.

For a better understanding, FIG. 32 shows demagnetization curves in an exaggerated manner. Fundamentally, since a temperature distribution is continuous, demagnetization curves have to be continuously innumerably plotted. Herein, for brevity's sake, a description will be made using three demagnetization curves 101, 102, and 103 as representatives. In addition, part of reference numerals and part of lead lines are excluded in order to simplify the drawing. A person with an ordinary skill in the art can accurately understand the drawing by referencing the aforesaid embodiments.

The demagnetization curves 101, 102, and 103 have remanent magnetic flux density points 104, 105, and 106 respectively, and have knickpoints 107, 108, and 109 respectively. The temperatures of parts of a permanent magnet associated with the demagnetization curves 101, 102, and 103 respectively are relatively low temperature, middle temperature, and high temperature respectively. Thus, even when plural demagnetization curves have to be taken into consideration for one permanent magnet, indices concerning demagnetization of the permanent magnet are requested to be indicated together.

$Br1$, $Br2$, and $Br3$ denote remanent magnetic flux densities indicated by the demagnetization curves 101, 102, and 103 respectively. $Hq1$, $Hq2$, and $Hq3$ denote magnetic fields at the knickpoints 107, 108, and 109 respectively, and $Bq1$, $Bq2$, and $Bq3$ denote magnetic flux densities thereat. In addition, magnetic fields at operating points on the demagnetization curves 101, 102, and 103 respectively are given $Hp1$, $Hp2$, and $Hp3$ respectively, and magnetic flux densities thereat are given $Bp1$, $Bp2$, and $Bp3$ respectively, though the operating points are not specified in the drawing.

Figure 33:
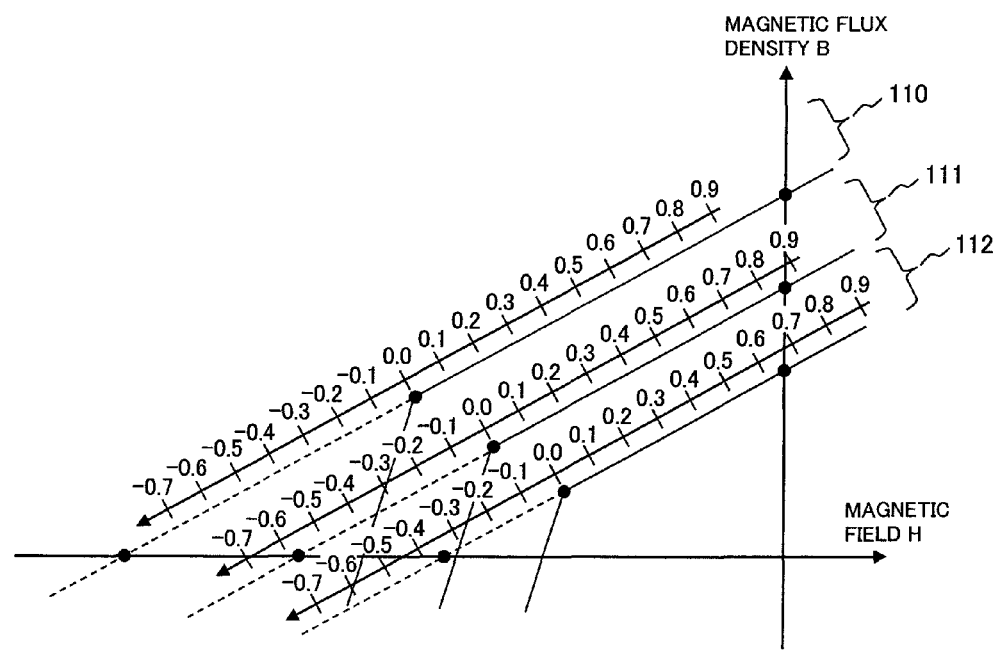
FIG. 33 is a diagram showing a method for analyzing operating points of the permanent magnet in the thirteenth embodiment.

FIG. 33 shows another analysis method for a position on a B-H curve of a permanent magnet, that is, an operating point in accordance with an embodiment of the method for analyzing operating points of a permanent magnet of the present invention. FIG. 33 shows three demagnetization curves. The demagnetization curves are identical to the three demagnetization curves 101, 102, and 103 shown in FIG. 32. Specifically, although no reference numerals are written, the demagnetization curves 101, 102, and 103 are plotted in that order from above in FIG. 33. In FIG. 33, reference numerals and lead lines identical to those in FIG. 32 are excluded to simplify the drawing.

The definitions of variables, each of which represents an operating point on each of the demagnetization curves 101, 102, and 103, are expressed by scales 110, 111, and 112 respectively. The definition scales 110, 111, and 112 of the variables each representing an operating point have the readings thereof at the knickpoints 107, 108, and 109 respectively set to a reference value. The reference value is zero in the present embodiment. In addition, the spacing between adjacent readings on the scale is identical among the scales 110, 111, and 112.

As easily understood from the embodiment shown in FIG. 29, the definition scales 110, 111, and 112 for the variables each representing an operating point specify a knickpoint likelihood indicated by the demagnetization curve 101, 102, or 103. Thus, when the variable representing an operating point is specified as the knickpoint likelihood, even if the demagnetization curve varies depending on part of a permanent magnet, a distribution of operating points in the entire permanent magnet can be expressed with the sole index of the knickpoint likelihood.

The variable representing an operating point on the demagnetization curve is defined as $$\frac{Bp1 - Bq1}{(Br1 + Br2 + Br3)/3}. \quad (25)$$

Likewise, the variable representing an operating point on the demagnetization curve 102 is defined as $$\frac{Bp2 - Bq2}{(Br1 + Br2 + Br3)/3}. \quad (26)$$

Likewise, the variable representing an operating point on the demagnetization curve 103 is defined as $$\frac{Bp3 - Bq3}{(Br1 + Br2 + Br3)/3}. \quad (27)$$

In the equations (25) to (27), the denominators represent a mean value of remanent magnetic flux densities indicated by the plural demagnetization curves.

A variable representing an operating point may be defined as presented below, though the variable is not illustrated in the present embodiment. Namely, the variable representing an operating point on the demagnetization curve 101 is defined as $$\frac{Bp1 - Bq1}{Br1 - Bq1}. \quad (28)$$

The variable representing an operating point on the demagnetization curve 102 is defined as $$\frac{Bp2 - Bq2}{Br2 - Bq2}. \quad (29)$$

The variable representing an operating point on the demagnetization curve 103 is defined as $$\frac{Bp3 - Bq3}{Br3 - Bq3}. \quad (30)$$

In this case, when an operating point on each of the demagnetization curves lies on the B axis, the variable representing the operating point takes on 1.0.

Figure 34:
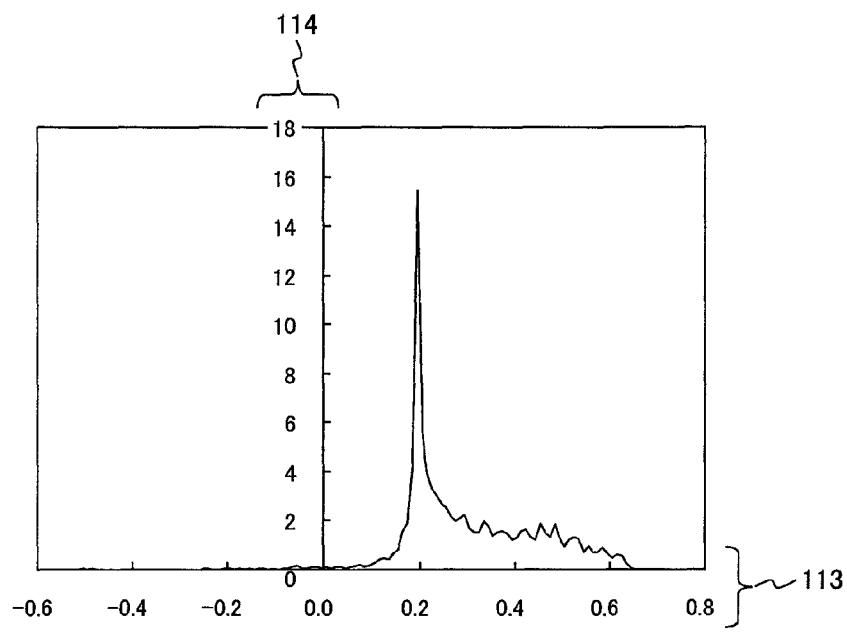
FIG. 34 is a diagram showing a volume histogram concerning a permanent magnet in the thirteenth embodiment.

FIG. 34 shows an analysis method for an operating point of a permanent magnet in accordance with the present embodiment, and a result of display performed by a program in which the analysis method is implemented. In FIG. 34, the horizontal axis 113 indicates a variable representing an operating point and being defined as shown in FIG. 33. If the variable is regarded as a knickpoint likelihood as mentioned above, the variable would be easily understood. The vertical axis 114 indicates a histogram value representing a volume in the permanent magnet.

An object of computation is the motor shown in FIG. 23. A permanent magnet 84 is designed to exhibit such a temperature distribution that the temperature continuously varies from an inner circumference side thereof, on which the temperature is 100° C., to an outer circumference side thereof on which the temperature is 140° C. The temperature distribution in the present embodiment is calculated through thermal analysis of the motor. Naturally, measured values may be used to learn the temperature distribution.

FIG. 34 is a diagram showing a volume histogram of a permanent magnet employed in the present embodiment. Based on a result of electromagnetic field analysis performed by feeding a conducting current of 300 amperes having a phase angle of 20°, variables representing operating points of parts of the permanent magnet 84 are obtained, and volume histograms associated with the parts of the permanent magnet are plotted. Even when a temperature distribution is observed in a permanent magnet and demagnetization curves are distributed, once the variables representing operating points are defined as shown in FIG. 33, the permanent magnet can be expressed with one index that is a knickpoint likelihood.

Embodiments in which a variable representing an operating point is linearly expressed along a B-H curve have been presented so far. The advantage of display of a histogram has been described in due course.

Next, an embodiment of the present invention in which display of a histogram is applied to a case where an operating point is represented by a conventional permeance coefficient.

Fourteenth Embodiment

Figure 35:
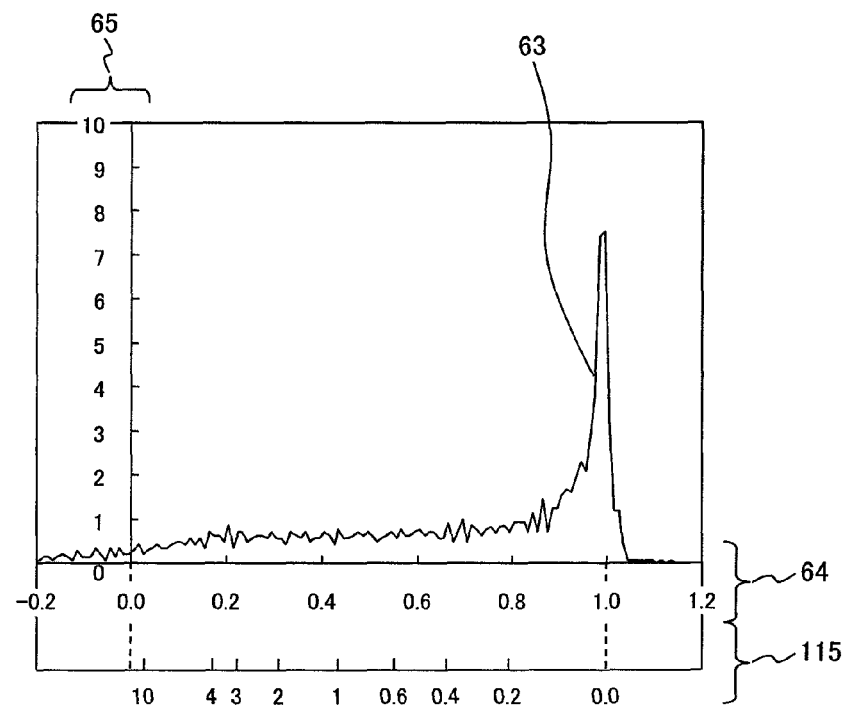
FIG. 35 is a diagram showing a histogram concerning the permanent magnet in a method for analyzing operating points of the permanent magnet in a fourteenth embodiment of the present invention.

FIG. 35 shows another analysis method for a position on a B-H curve of a permanent magnet, that is, an operating point in accordance with an embodiment of the method for analyzing operating points of a permanent magnet of the present invention, and a result of display performed using a program in which the analysis method is implemented. FIG. 35 shows the same histogram as FIG. 18 does, but the horizontal axis thereof is different from that of FIG. 28. An upper horizontal axis 64 is identical to the horizontal axis of FIG. 18, and a lower horizontal axis 115 indicates a permeance coefficient shown in FIG. 6. The permeance coefficient is a product of the value 28 of the permeance coefficient shown in FIG. 6 by a permeability μo in a vacuum. In FIG. 35, the permeability μo in a vacuum is not shown.

Figure 6:
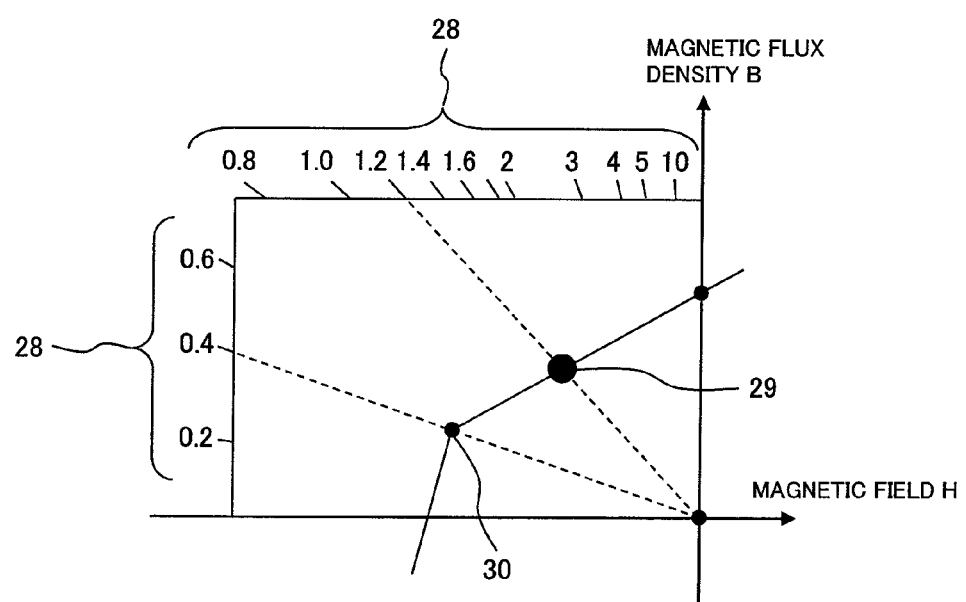
FIG. 6 is a diagram showing an example in which a permeance coefficient at an operating point is indicated in a graph in which a demagnetization curve and the operating point are plotted.

As seen by comparing FIG. 6 with FIG. 17, it is easy to convert the horizontal axis 64, which indicates a variable representing an operating point, into the horizontal axis 115. The conversion may be achieved using equations expressing the variable and permeance coefficient respectively. Alternatively, a histogram may be plotted using the horizontal axis 115 indicating the permeance coefficient.

Figure 36:
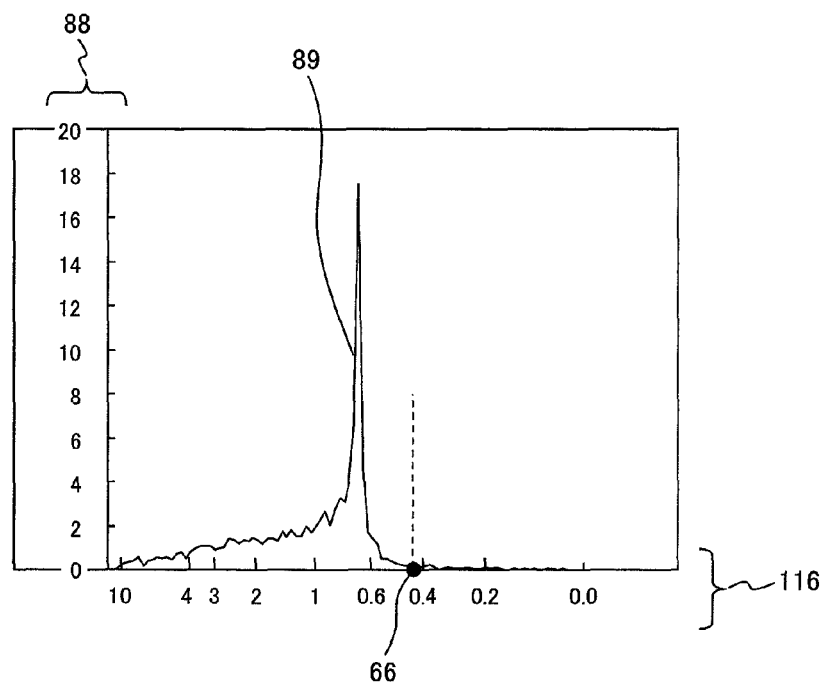
FIG. 36 is a diagram showing a histogram whose horizontal axis indicates the permeance coefficients in the fourteenth embodiment.

FIG. 36 shows a histogram plotted based on the histogram in FIG. 26 using the horizontal axis, which indicates the permeance coefficient, according to a similar method. In FIG. 36, the horizontal axis indicates a permeance coefficient 116 alone.

Figure 37:
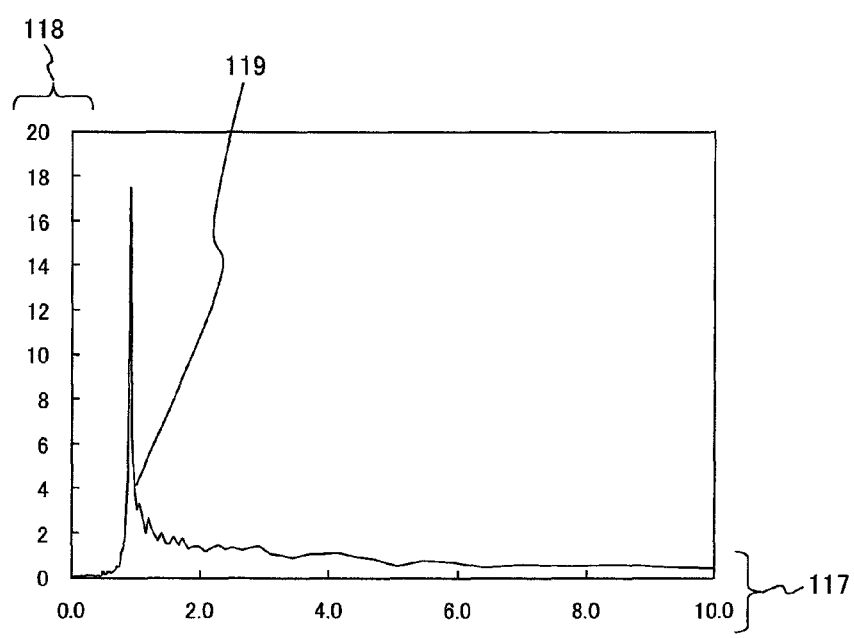
FIG. 37 is a diagram showing a histogram whose horizontal axis indicates the permeance coefficients with a uniform scale in the fourteenth embodiment.

FIG. 37 shows a result of display of the histogram, which is shown in FIG. 36, by marking a uniform scale on the horizontal axis. FIG. 37 shows the histogram by expressing a variable, which represents an operating point, with the uniform scale of a permeance coefficient. Thus, even when the variable representing an operating point is specified with the permeance coefficient, volumes in a permanent magnet can be expressed with the histogram. This also is encompassed by the present invention.

The embodiments of the present invention have been described as cases where a demagnetization curve can be regarded as a straight line. The present invention can apply to a case where the demagnetization curve is treated as a curve that is part of an actual B-H curve shown in FIG. 1.

Fifteenth Embodiment

Figure 38:
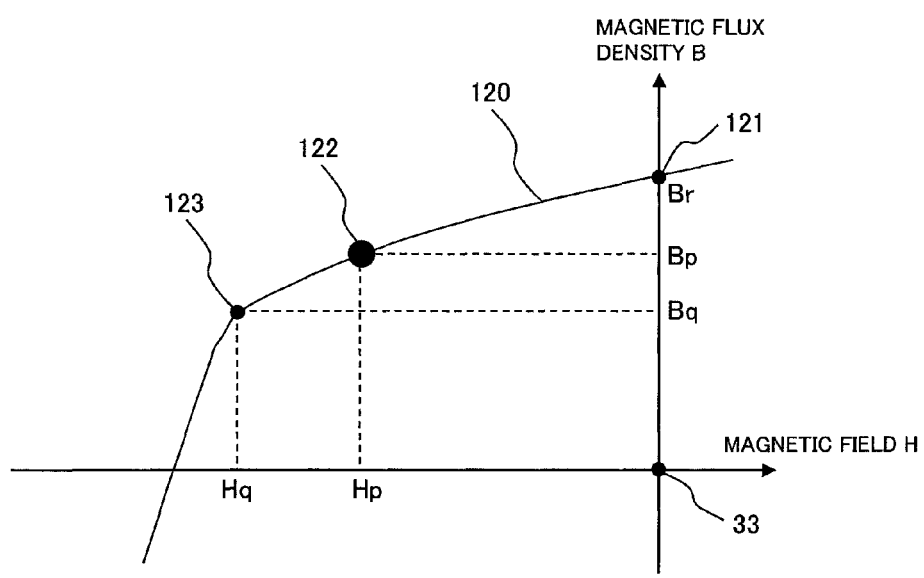
FIG. 38 is a diagram showing a demagnetization curve in a fifteenth embodiment of the present invention.

FIG. 38 shows a demagnetization curve used to present another analysis method for a position on a B-H curve of a permanent magnet, that is, an operating point in accordance with an embodiment of the method for analyzing operating points of a permanent magnet of the present invention, and a result of display performed by a program in which the analysis method is implemented. A demagnetization curve 120 is plotted as a curve of part of a B-H curve. At this time, Br denotes a value at a remanent magnetic flux density point 121, and Bp and Hp denote a magnetic flux density and a magnetic field at an operating point 122. In addition, Bq and Hq denote a magnetic flux density and a magnetic field at a point 123 at which irreversible demagnetization sharply increases.

When a variable representing an operating point is defined using the same way of thinking as that employed for FIG. 9 and the equation (18), an equation is drawn out as $$1 - \frac{Bp}{Br}. \qquad (31)$$

When the variable representing an operating point is defined using the same way of thinking as that employed for FIG. 29 and the equation (23), an equation is drawn out as $$\frac{Bp - Bq}{Br}. \qquad (32)$$

The definition expressed by the equation (32) is made from the viewpoint of a knickpoint likelihood. The point 123 at which irreversible demagnetization sharply increases is substantially regarded as a knickpoint.

An embodiment in which the foregoing method is described in a flowchart will be presented below.

Sixteenth Embodiment

Figure 39:
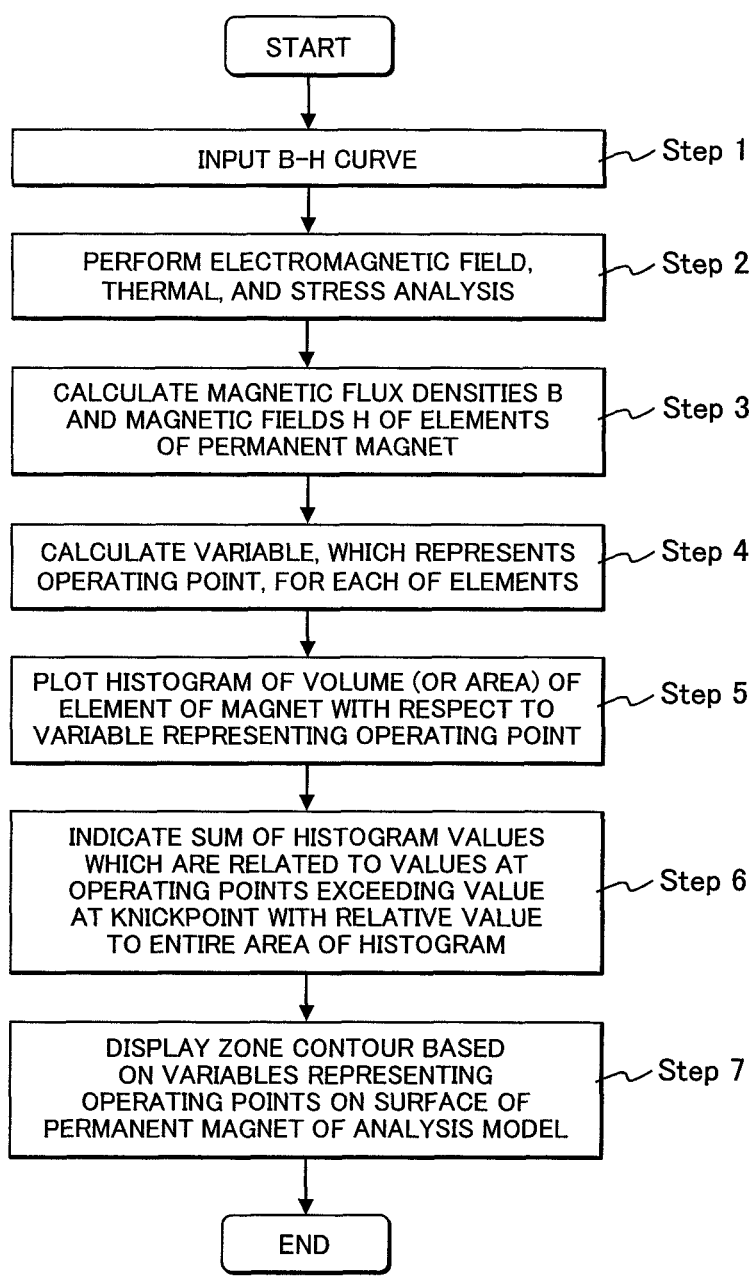
FIG. 39 is a flowchart of a method for analyzing operating points of the permanent magnet and a program therefor in a sixteenth embodiment of the present invention.

FIG. 39 is a flowchart describing actions to be performed according to the analysis method for a position on a B-H curve of a permanent magnet, that is, an operating point in accordance with an embodiment of the method for analyzing operating points of a permanent magnet of the present invention, or actions to be performed by a program in which the analysis method is implemented. According to the flowchart shown in FIG. 39, a computer that is an arithmetic device uses an input unit, an analysis unit, a memory unit, and a display unit to perform inputting of data, analysis thereof, storage of input data and analytic data, and display of a result of analysis. The flowchart shown in FIG. 39 will be described below.

At step 1, the input unit inputs a B-H curve that is employed in electromagnetic field analysis and analysis of an operating point. Data of the inputted B-H curve is stored in the memory unit. In addition, element data concerning a finite number of elements into which a permanent magnet is divided is inputted and stored in the memory unit.

At step 2, the analysis unit reads the data of the B-H curve and the element data of the permanent magnet, which are stored in the memory unit, and performs electromagnetic field analysis on an analysis model, which includes the permanent magnet, on the basis of the read data items. At this time, thermal analysis or stress analysis may be performed concurrently.

At step 3, the analysis unit calculates a magnetic flux density B and a magnetic field H of each of the elements, which constitute the permanent magnet, on the basis of a result of analysis.

At step 4, the analysis unit calculates a variable, which represents an operating point, for each of the elements of the permanent magnet. For a method for defining the variable representing an operating point, the aforesaid embodiments should be referenced. For example, any of the equations (16) to (32) is adopted for the definition.

At step 5, the analysis unit plots a histogram of a volume of an element of the magnet with respect to a variable representing an operating point. Herein, if the analysis model is two-dimensional, a histogram of an area of an element of the magnet is plotted. Referring to any of the aforesaid embodiments, a histogram like the one shown in FIG. 18, for example, is plotted.

At step 6, the display unit indicates a sum of histogram values which are related to values at operating points exceeding a value at a knickpoint with a relative value to the sum total of histogram values. Referring to the aforesaid embodiment, the area of the domain 67 in FIG. 18 is indicated with a relative value to the entire area of the histogram. A user of an analysis method in accordance with the present invention or a program in which the analysis method is implemented can quantitatively decide that part of the permanent magnet equivalent to the area of the domain (domain 67 in FIG. 18) in which the values at the operating points exceed the value at the knickpoint is irreversibly demagnetized.

At step 7, the display unit displays a zone contour based on the variable representing the operating point on the surface of the permanent magnet portion of the analysis model. Referring to the aforesaid embodiment, for example, the zone contour is displayed as shown in FIG. 13 or FIG. 24. The ratio of part of the permanent magnet, which is obtained at step 6 and may be irreversibly demagnetized, is evaluated together with the zone contour obtained at step 7, whereby a user can quantitatively grasp the part of the permanent magnet that may be irreversibly demagnetized.

Seventeenth Embodiment

Figure 41:
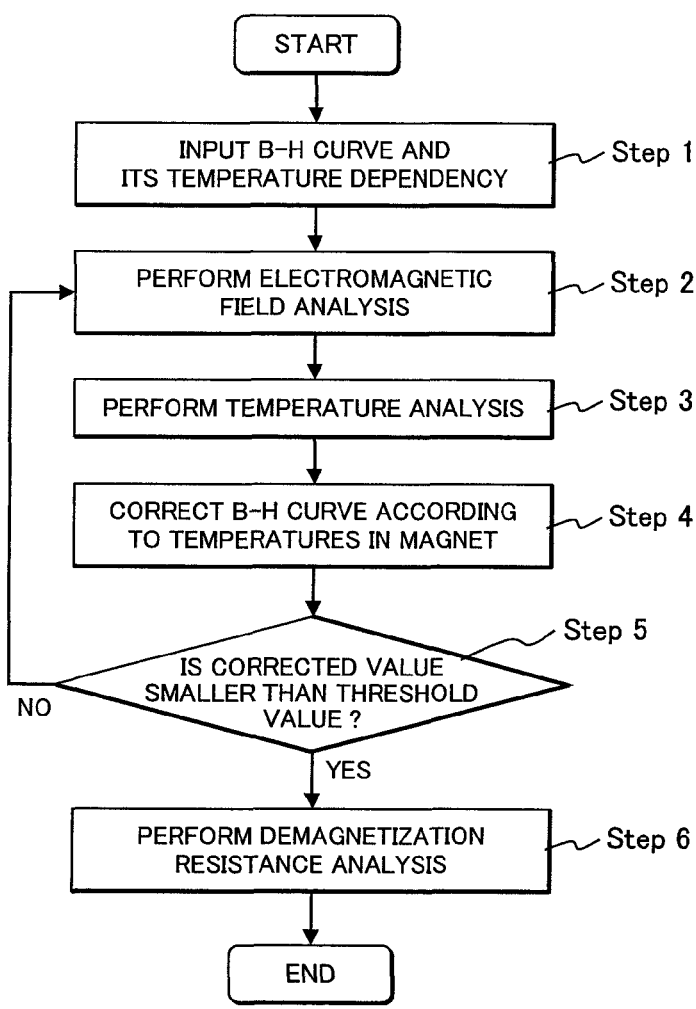
FIG. 41 is a flowchart of a method for analyzing operating points of the permanent magnet and a program therefor in a seventeenth embodiment of the present invention.

Next, an analysis method to be employed when since a temperature distribution is observed in a permanent magnet, demagnetization curves are distributed will be described in conjunction with FIG. 41. FIG. 41 is a flowchart describing actions to be performed according to the analysis method for an operating point of a permanent magnet in accordance with the present invention, or actions to be performed by a program in which the analysis method is implemented. According to the flowchart shown in FIG. 41, a computer that is an arithmetic device uses an input unit, an analysis unit, a memory unit, and a display unit to perform inputting of data, analysis thereof, storage of input data and analytic data, and display of a result of analysis. The flowchart shown in FIG. 41 will be described below.

At step 1, the input unit inputs a B-H curve to be employed in electromagnetic analysis and analysis of an operating point. In addition, data of a temperature dependency of the B-H curve is inputted. The inputted B-H curve data and the inputted data of the temperature dependency of the B-H curve are stored in the memory unit. Further, element data concerning a finite number of elements into which a permanent magnet is divided is inputted and stored in the memory unit, though it is not described in the drawing.

At step 2, the analysis unit reads the data of the B-H curve and the element data of the permanent magnet, which are stored in the memory unit, and performs electromagnetic analysis on an analysis model, which includes the permanent magnet, on the basis of the read data items.

At step 3, the analysis unit performs temperature analysis using conditions for heat dissipation derived from an eddy current or heat dissipation due to a hysteresis loss which are obtained at step 2.

At step 4, the analysis unit uses a temperature distribution in the permanent magnet, which is obtained at step 3, and the data of the temperature dependency of the B-H curve, which is stored in the memory unit at step 1, to correct the B-H curve for each of the elements of the permanent magnet.

At step 5, the analysis unit decides whether the corrected value for the B-H curve is smaller than a threshold value. The threshold value may be designated by software or may be entered at the input unit by a user. If the corrected value is equal to or larger than the threshold value, the procedure returns to step 2, and the corrected B-H curve is used to perform electromagnetic field analysis. If the corrected value falls below the threshold value, temperature analysis and electromagnetic field analysis are thought to have converged. The procedure then proceeds to step 6.

At step 6, the analysis unit performs demagnetization resistance analysis. The demagnetization resistance analysis includes the processes of steps 3 to 7 described in the flowchart of FIG. 39.

Eighteenth Embodiment

Even when a method for analyzing operating points of a permanent magnet and a program for analyzing operating points of a permanent magnet, in which the present invention is implemented, do not display a histogram by itself, histogram display data may be outputted. The histogram display data is typically text data having columns of variable values, which represent operating points, and of histogram values, and can be read by spreadsheet software and graphically displayed. The histogram display data may be outputted in a data format suitable for software, which displays the histogram, but may not be outputted in the form of the text data.

The analysis unit included in the computer that is an arithmetic device outputs the histogram display data after obtaining operating points. The output destination may be the memory unit included in the computer, or may be an external storage device connected to the computer.

What is claimed is:

1. A method for analyzing an operating point of a permanent magnet, which performs electromagnetic field analysis based on a magnetic flux density versus magnetic field curve of the permanent magnet and element data concerning a finite number of elements into which the permanent magnet is divided in order to obtain the operating point of the permanent magnet by using an arithmetic device including an analysis unit, a memory unit, and a display unit, comprising the steps of:

storing data of inputted magnetic flux density versus magnetic field curve in the memory unit;

obtaining magnetic flux densities and magnetic fields in a plurality of regions of the permanent magnet by performing the electromagnetic field analysis based on the data of the magnetic flux density versus magnetic field curve stored in the memory unit by using the analysis unit; and obtaining the operating point of each of the elements based on the result of the electromagnetic field analysis by employing a variable, the variable continuously varying in a first quadrant, in a second quadrant, in a third quadrant, and over these quadrants of the magnetic flux density versus magnetic field curve and linearly varying with respect to the magnetic flux density and magnetic field;

wherein, at the step of obtaining the operating point, the variable representing the operating point takes on a reference value when the operating point coincides with a point of an intercept on a magnetic flux density axis of the magnetic flux density versus magnetic field curve;

wherein, at the step of obtaining the operating point, the variable representing the operating point denotes a value of the operating point coincident with the point of an intercept on the magnetic field axis of the magnetic flux density versus magnetic field curve by 1, and denotes the operating point in the third quadrant of the magnetic flux density versus magnetic field curve by a value larger than 1; and wherein, at the step of obtaining the operating point, the variable representing the operating point is expressed as Hp/bHc or 1-(Bp/Br), where Bp and Hp denote a magnetic flux density and a magnetic field at the operating point, respectively, and Br and bHc denote an intercept on the magnetic flux density axis of the magnetic flux density versus magnetic field curve and an intercept on the magnetic field axis thereof, respectively.

2. A method for analyzing an operating point of a permanent magnet, which performs electromagnetic field analysis based on a magnetic flux density versus magnetic field curve of the permanent magnet and element data concerning a finite number of elements into which the permanent magnet is divided in order to obtain the operating point of the permanent magnet by using an arithmetic device including an analysis unit, a memory unit, and a display unit, comprising the steps of:

storing data of inputted magnetic flux density versus magnetic field curve in the memory unit;

obtaining magnetic flux densities and magnetic fields in a plurality of regions of the permanent magnet by performing the electromagnetic field analysis based on the data of the magnetic flux density versus magnetic field curve stored in the memory unit by using the analysis unit; and obtaining the operating point of each of the elements based on the result of the electromagnetic field analysis by employing a variable, the variable continuously varying in a first quadrant, in a second quadrant, in a third quadrant, and over these quadrants of the magnetic flux density versus magnetic field curve and linearly varying with respect to the magnetic flux density and magnetic field;

wherein, at the step of obtaining the operating point, the variable representing the operating point takes on a reference value when the operating point coincides with a point of an intercept on a magnetic field axis of the magnetic flux density versus magnetic field curve;

wherein, at the step of obtaining the operating point, the variable representing the operating point denotes a value of the operating point coincident with the point of an intercept on the magnetic flux density axis of the magnetic flux density versus magnetic field curve by 1, and denotes the operating point in the first quadrant of the magnetic flux density versus magnetic field curve by a value larger than 1; and wherein, at the step of obtaining the operating point, the variable representing the operating point is expressed as 1-(Hp/bHc) or Bp/Br, where Bp and Hp denote a magnetic flux density and a magnetic field at the operating point, respectively, and Br and bHc denote an intercept on the magnetic flux density axis of the magnetic flux density versus magnetic field curve and an intercept on the magnetic field axis thereof, respectively.

3. A method for analyzing an operating point of a permanent magnet, which performs electromagnetic field analysis based on a magnetic flux density versus magnetic field curve of the permanent magnet and element data concerning a finite number of elements into which the permanent magnet is divided in order to obtain the operating point of the permanent magnet by using an arithmetic device including an analysis unit, a memory unit, and a display unit, comprising the steps of:

wherein, at the step of obtaining the operating point, the variable representing the operating point takes on a reference value when the operating point coincides with a knickpoint of the magnetic flux density versus magnetic field curve;

storing data of inputted magnetic flux density versus magnetic field curve in the memory unit;

obtaining magnetic flux densities and magnetic fields in a plurality of regions of the permanent magnet by performing the electromagnetic field analysis based on the data of the magnetic flux density versus magnetic field curve stored in the memory unit by using the analysis unit; and obtaining the operating point of each of the elements based on the result of the electromagnetic field analysis by employing a variable, the variable continuously varying in a first quadrant, in a second quadrant, in a third quadrant, and over these quadrants of the magnetic flux density versus magnetic field curve and linearly varying with respect to the magnetic flux density and magnetic field;

wherein, at the step of obtaining the operating point, the variable representing the operating point denotes the reference value by zero; and wherein, at the step of obtaining the operating point, the variable representing the operating point is expressed as (Bp−Bq)/Br or (Bp−Bq)/(Br−Bq), where Bp denotes a magnetic flux density at the operating point, Br denotes an intercept on the magnetic flux density axis of the magnetic flux density versus magnetic field curve, and Bq denotes a magnetic flux density at the knickpoint.

4. A method for analyzing an operating point of a permanent magnet, which performs electromagnetic field analysis based on a magnetic flux density versus magnetic field curve of the permanent magnet and element data concerning a finite number of elements into which the permanent magnet is divided in order to obtain the operating point of the permanent magnet by using an arithmetic device including an analysis unit, a memory unit, and a display unit, comprising the steps of:

storing data of inputted magnetic flux density versus magnetic field curve in the memory unit;

obtaining magnetic flux densities and magnetic fields in a plurality of regions of the permanent magnet by performing the electromagnetic field analysis based on the data of the magnetic flux density versus magnetic field curve stored in the memory unit by using the analysis unit; and obtaining the operating point of each of the elements based on the result of the electromagnetic field analysis by employing a variable, the variable continuously varying in a first quadrant, in a second quadrant, in a third quadrant, and over these quadrants of the magnetic flux density versus magnetic field curve and linearly varying with respect to the magnetic flux density and magnetic field;

wherein, at the step of obtaining the operating point, the magnetic flux density versus magnetic field curve is replaced with a magnetization versus magnetic field curve, and the variable representing the operating point takes on a reference value when the operating point coincides with a point of an intercept on a magnetic field axis of the magnetization versus magnetic field curve;

wherein, at the step of obtaining the operating point, the variable representing the operating point denotes the reference value by zero; and wherein, at the step of obtaining the operating point, the variable representing the operating point is expressed as 1-(Hp/iHc), where Hp denotes a magnetic field at the operating point and an intrinsic coercive force iHc denotes an intercept on the magnetic field axis of the magnetization versus magnetic field curve.

5. A method for analyzing an operating point of a permanent magnet, which performs electromagnetic field analysis based on a magnetic flux density versus magnetic field curve of the permanent magnet and element data concerning a finite number of elements into which the permanent magnet is divided in order to obtain the operating point of the permanent magnet by using an arithmetic device including an analysis unit, a memory unit, and a display unit, comprising the steps of:

storing data of inputted magnetic flux density versus magnetic field curve in the memory unit;

obtaining magnetic flux densities and magnetic fields in a plurality of regions of the permanent magnet by performing the electromagnetic field analysis based on the data of the magnetic flux density versus magnetic field curve stored in the memory unit by using the analysis unit; and obtaining the operating point of each of the elements based on the result of the electromagnetic field analysis by employing a variable, the variable continuously varying in a first quadrant, in a second quadrant, in a third quadrant, and over these quadrants of the magnetic flux density versus magnetic field curve and linearly varying with respect to the magnetic flux density and magnetic field; and displaying a histogram on the display unit, wherein a horizontal axis in the histogram indicates the variable representing the operating point, wherein a vertical axis in the histogram indicates an area of each of the elements with respect to the variable representing the operating point when the electromagnetic field analysis is two-dimensional analysis, and the vertical axis indicates a volume of each of the elements with respect to the variable representing the operating point when the electromagnetic field analysis is three-dimensional analysis; and wherein, at the step of displaying the histogram, at least one of the operating point coincident with the knickpoint of the magnetic flux density versus magnetic field curve, the operating point which indicates the intrinsic coercive force iHc of the permanent magnet, and one or more operating points which are arbitrarily designated by a user are marked on the horizontal axis.

6. The method for analyzing an operating point of a permanent magnet according to claim 5,
wherein, at the step of displaying the histogram, the histogram is normalized so that a sum thereof is 1 or 100.

7. The method for analyzing an operating point of a permanent magnet according to claim 5,
wherein, at the step of displaying a histogram, the histogram is divided into a plurality of domains by a value of at least one of the operating points which are marked on the horizontal axis, the value being regarded as a border, and a sum of values in at least one of the domains of the histogram is calculated and displayed.

8. The method for analyzing an operating point of a permanent magnet according to claim 7,
wherein, at the step of displaying a histogram, among the domains into which the histogram is divided, a domain indicated by the operating point associated with a larger absolute value of the magnetic field than an absolute value of the magnetic field corresponding to the border is displayed as a domain where the permanent magnet irreversibly demagnetizes.

9. A method for analyzing an operating point of a permanent magnet, which performs electromagnetic field analysis based on a magnetic flux density versus magnetic field curve of the permanent magnet and element data concerning a finite number of elements into which the permanent magnet is divided in order to obtain the operating point of the permanent magnet by using an arithmetic device including an analysis unit, a memory unit, and a display unit, comprising the steps of:

storing data of inputted magnetic flux density versus magnetic field curve in the memory unit;

obtaining magnetic flux densities and magnetic fields in a plurality of regions of the permanent magnet by performing the electromagnetic field analysis based on the data of the magnetic flux density versus magnetic field curve stored in the memory unit by using the analysis unit; and obtaining the operating point of each of the elements based on the result of the electromagnetic field analysis by employing a variable, the variable continuously varying in a first quadrant, in a second quadrant, in a third quadrant, and over these quadrants of the magnetic flux density versus magnetic field curve and linearly varying with respect to the magnetic flux density and magnetic field; and displaying a histogram on the display unit, wherein a horizontal axis in the histogram indicates the variable representing the operating point, wherein a vertical axis in the histogram indicates an area of each of the elements with respect to the variable representing the operating point when the electromagnetic field analysis is two-dimensional analysis, and the vertical axis indicates a volume of each of the elements with respect to the variable representing the operating point when the electromagnetic field analysis is three-dimensional analysis; and wherein the variable representing the operating point and a permeance coefficient representing the operating point are displayed on the horizontal axis in the histogram.

* * * * *